United States Patent
Zhao et al.

(10) Patent No.: US 10,643,718 B2
(45) Date of Patent: May 5, 2020

(54) NON-VOLATILE MEMORY WITH COUNTERMEASURE FOR PROGRAM DISTURB INCLUDING PURGE DURING PRECHARGE

(71) Applicant: SANDISK TECHNOLOGIES LLC, Addison, TX (US)

(72) Inventors: Dengtao Zhao, Santa Clara, CA (US); Peng Zhang, San Jose, CA (US); Nan Lu, San Jose, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 69 days.

(21) Appl. No.: 16/002,825

(22) Filed: Jun. 7, 2018

(65) Prior Publication Data

US 2019/0378580 A1    Dec. 12, 2019

(51) Int. Cl.
| | |
|---|---|
| *G11C 16/34* | (2006.01) |
| *G11C 16/04* | (2006.01) |
| *G11C 11/408* | (2006.01) |
| *G11C 8/08* | (2006.01) |
| *G11C 16/12* | (2006.01) |

(52) U.S. Cl.
CPC ............ *G11C 16/3427* (2013.01); *G11C 8/08* (2013.01); *G11C 11/4085* (2013.01); *G11C 16/0483* (2013.01); *G11C 16/12* (2013.01); *G11C 16/3459* (2013.01)

(58) Field of Classification Search
CPC ............ G11C 16/3427; G11C 16/3459; G11C 16/0483; G11C 8/08; G11C 11/4085; G11C 16/12
See application file for complete search history.

(56) References Cited

U.S. PATENT DOCUMENTS

| | | |
|---|---|---|
| 6,859,397 B2 | 2/2005 | Lutze |
| 7,355,889 B2 | 4/2008 | Hemink |
| 7,433,241 B2 | 10/2008 | Dong |
| 7,440,323 B2 | 10/2008 | Lutze |
| 7,460,404 B1 | 12/2008 | Dong |
| 7,463,531 B2 | 12/2008 | Hemink |
| 7,623,386 B2 | 11/2009 | Dong |
| 7,852,675 B2 | 12/2010 | Maejima |

(Continued)

OTHER PUBLICATIONS

U.S. Appl. No. 15/678,683, filed Aug. 16, 2017, by Chen et al.

(Continued)

*Primary Examiner* — Mohammed A Bashar
(74) *Attorney, Agent, or Firm* — Vierra Magen Marcus LLP

(57) ABSTRACT

Program disturb is a condition that includes the unintended programming of a memory cell while performing a programming process for other memory cells. Such unintended programming can cause an error in the data being stored. In some cases, program disturb can result from electrons trapped in the channel being accelerated from one side of a selected word line to another side of the selected word line and redirected into the selected word line. To prevent such program disturb, it is proposed to open the channel from one side of a selected word line to the other side of the selected word line after a sensing operation for program verify and prior to a subsequent programming voltage being applied.

21 Claims, 20 Drawing Sheets

(56) References Cited

U.S. PATENT DOCUMENTS

| | | |
|---|---|---|
| 8,537,617 B2 | 9/2013 | Kim |
| 8,670,285 B2 | 3/2014 | Dong |
| 8,854,890 B1 * | 10/2014 | Miwa .................. G11C 16/0483 365/185.02 |
| 9,093,157 B2 | 7/2015 | Kwak |
| 9,171,632 B2 | 10/2015 | Dong |
| 9,286,987 B1 | 3/2016 | Dong |
| 9,286,994 B1 | 3/2016 | Chen |
| 9,336,892 B1 | 5/2016 | Chen |
| 9,361,993 B1 | 6/2016 | Chen |
| 9,406,391 B1 | 8/2016 | Chen |
| 9,412,463 B1 | 8/2016 | Chen |
| 9,466,369 B1 | 10/2016 | Pang |
| 9,530,506 B2 | 12/2016 | Rabkin |
| 9,640,273 B1 | 5/2017 | Chen |
| 9,640,278 B1 | 5/2017 | Xi |
| 9,691,781 B1 | 6/2017 | Nishikawa |
| 9,704,588 B1 | 7/2017 | Ray |
| 9,747,992 B1 | 8/2017 | Chen |
| 9,761,320 B1 | 9/2017 | Chen |
| 9,887,002 B1 | 2/2018 | Zhang |
| 9,905,305 B2 | 2/2018 | Chen |
| 9,922,705 B1 | 3/2018 | Diep |
| 2008/0186776 A1 | 8/2008 | Kim |
| 2013/0242667 A1 | 9/2013 | Shim |
| 2016/0099066 A1 * | 4/2016 | Dunga .................. G11C 16/24 365/185.17 |
| 2016/0148691 A1 | 5/2016 | Rabkin |
| 2017/0352430 A1 | 12/2017 | Chen |

OTHER PUBLICATIONS

U.S. Appl. No. 15/693,982, filed Sep. 1, 2017, by Diep et al.
U.S. Appl. No. 15/726,686, filed Oct. 6, 2017, by Yu et al.
U.S. Appl. No. 15/383,852, filed Dec. 19, 2016, by Chen et al.
U.S. Appl. No. 15/172,653, filed Jun. 3, 2016, by Chen et al.

* cited by examiner

|              | S0 | S1 | S2 | S3 | S4 | S5 | S6 | S7 |
|--------------|----|----|----|----|----|----|----|----|
| Upper Page   | 1  | 1  | 1  | 0  | 0  | 0  | 0  | 1  |
| Middle Page  | 1  | 1  | 0  | 0  | 1  | 1  | 0  | 0  |
| Lower Page   | 1  | 0  | 0  | 0  | 0  | 1  | 1  | 1  |

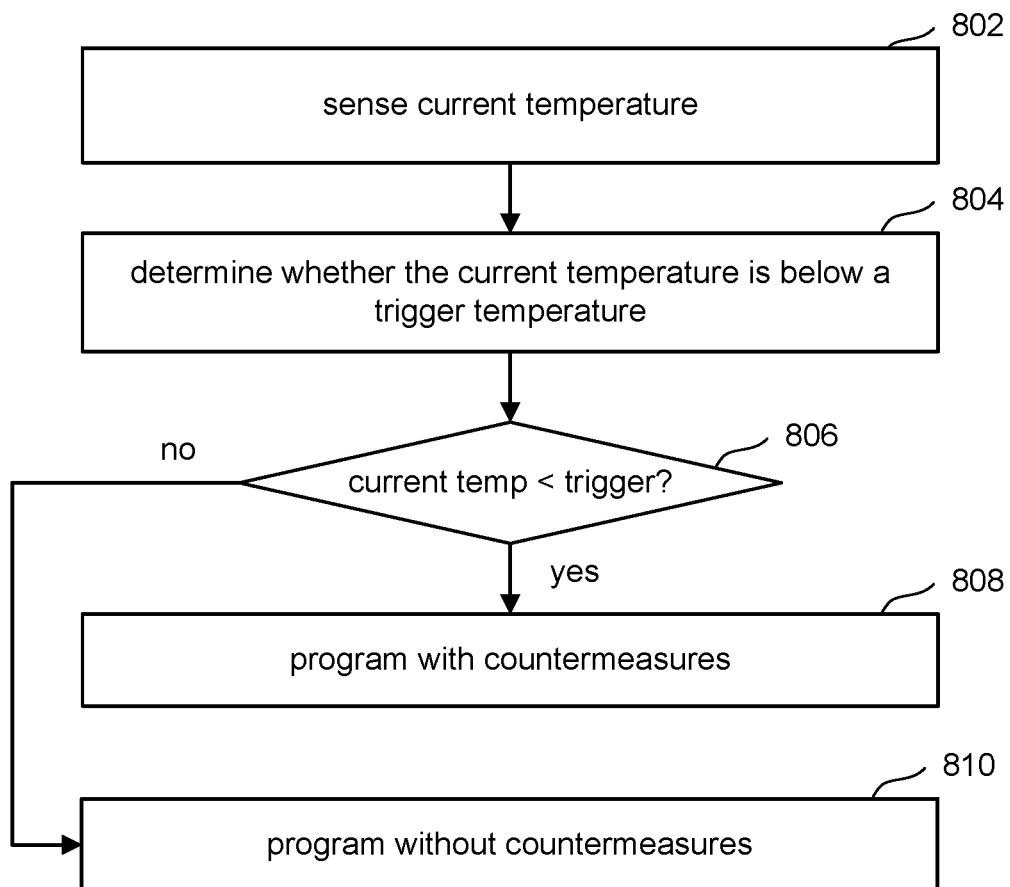

NON-VOLATILE MEMORY WITH COUNTERMEASURE FOR PROGRAM DISTURB INCLUDING PURGE DURING PRECHARGE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that when data stored in the memory system is read back and reported to the host device, client, user or other entity, the data is reported back accurately.

BRIEF DESCRIPTION OF THE DRAWINGS

Like-numbered elements refer to common components in the different figures.

FIG. 15 is a flow chart describing one embodiment of a process for using temperature sensing to turn on/off the various countermeasures proposed by avoiding program disturb.

DETAILED DESCRIPTION

Figure 1:
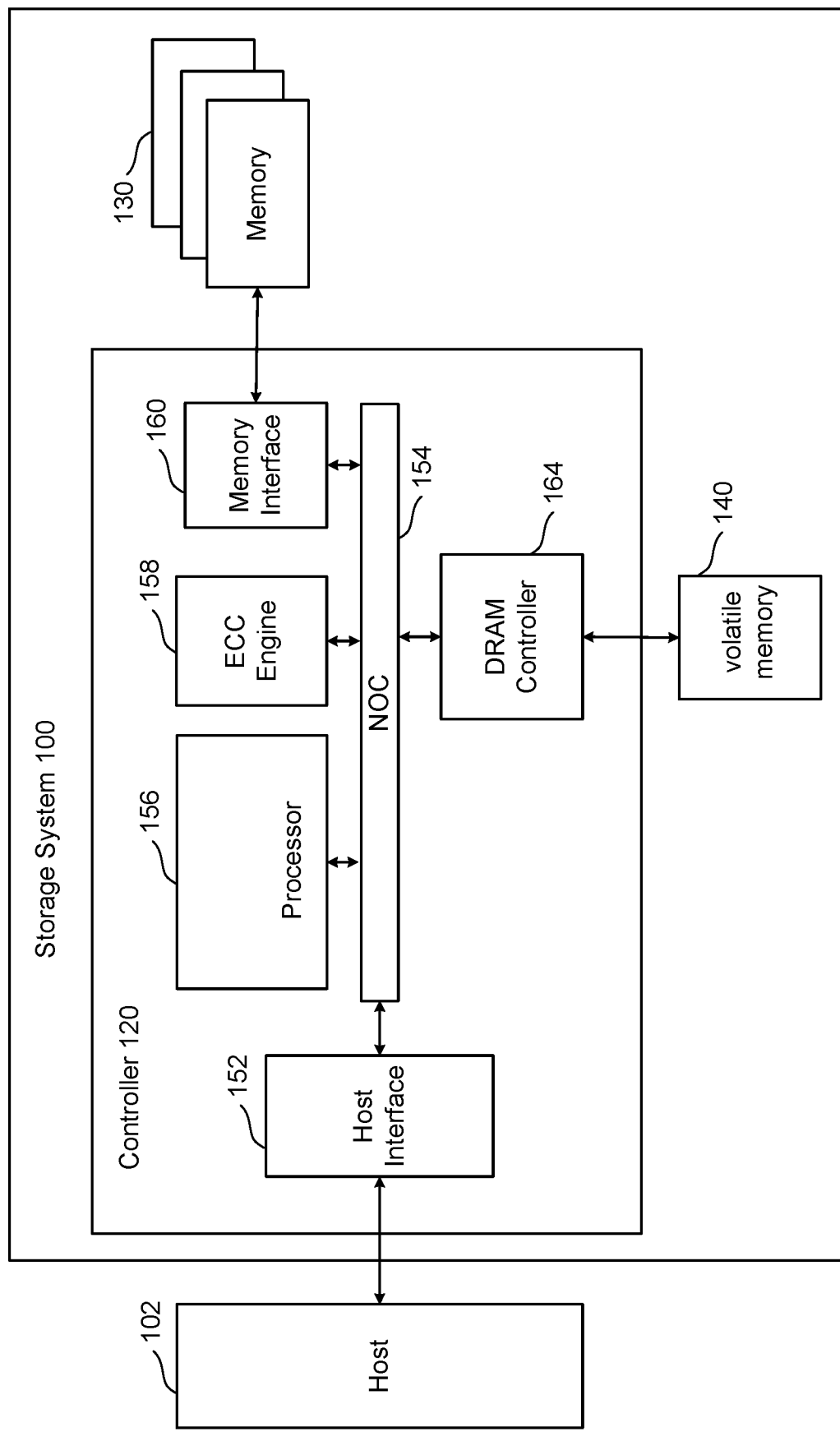
FIG. 1 is a block diagram depicting one embodiment of a memory system.

Program disturb is a condition that includes the unintended programming of one or more locations in a memory while performing a programming process for other locations in the memory. Such unintended programming can cause an error in the data being stored. In some cases, program disturb can result from electrons trapped in the channel being accelerated from one side of a selected word line to another side of the selected word line and redirected into the selected word line. To prevent such program disturb, countermeasures are proposed to open the channel from one side of a selected word line to the other side of the selected word line (e.g., from the source side of the selected word line to the drain side of the selected word line or from the already programmed side of the selected word line to the not yet programmed side of the selected word line) after a sensing operation for program verify and prior to a subsequent programming signal being applied.

One proposed countermeasure includes purging (cleaning/clearing the electrons from) the already programmed side of the channel during a pre-charge operation performed as part of the programming process. One example embodiment includes a plurality of groups of connected non-volatile memory cells with each group including a channel, a plurality of control lines connected to the groups of connected non-volatile memory cells, and a control circuit connected to the control lines. One example of a group of connected non-volatile memory cells is a NAND string; however, other groups can also apply. The control circuit is configured to program a first subset of memory cells connected to a selected control line and inhibit programming of a second subset of memory cells that are connected to the selected control line and are in unselected groups by applying a programming signal to the selected control line and applying boosting signals to unselected control lines to boost channels of the unselected groups. The control circuit is further configured to pre-charge channels of unselected groups prior to the applying boosting signals and apply a bypass voltage to one or more already programmed unselected control lines adjacent to the selected control line while pre-charging channels of unselected groups.

Another proposed countermeasure includes applying a voltage spike on one or more already programmed unselected word lines adjacent the selected word line during boosting of the not yet programmed side of the channel. One example embodiment of such a solution includes a plurality of groups of connected non-volatile memory cells with each group including a respective channel, a plurality of control lines connected to the groups of connected non-volatile memory cells and a control circuit connected to the control lines. The control circuit is configured to program a first subset of memory cells connected to a selected control line and inhibit programming of a second subset of memory cells connected to the selected control line by applying a programming signal to the selected control line and applying boosting signals to unselected control lines to boost channels of groups of connected non-volatile memory cells that include the second subset of memory cells. The applying boosting signals includes applying a spike in a boosting signal for one or more already programmed unselected control lines adjacent to the selected control line while applying the boosting signals to not yet programmed unselected control lines.

Another proposed countermeasure includes delaying the ramping down of voltages of one or more already programmed unselected word lines adjacent the selected word line at the conclusion of a program verify process. One example embodiment includes a first plurality of connected non-volatile memory cells, a plurality of control lines connected to the first plurality of connected non-volatile memory cells, and a control circuit connected to the control lines. The control circuit is configured to verify programming of a selected memory cell of the first plurality of connected non-volatile memory cells that is connected to a selected control line by applying voltages to the plurality of control lines, sensing the selected memory cell and ramping down the voltages on the control lines after performing the sensing such that one or more already programmed unselected control lines adjacent to the selected control line is ramped down subsequent to ramping down other control lines. In one embodiment, this delay could be applied to the last program verify operations after a program high voltage pulse to minimize the performance impact to program.

In some embodiments, the memory system comprises many memory cells (e.g., millions of memory cells). A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the "selected memory cells" while the memory cells that are not intended to take on a new electrical characteristic (or other characteristic) to reflect a changed programming state are referred to as the "unselected memory cells". In certain situations, unselected memory cells may be connected to the same word line as selected memory cells. Unselected memory cells may also be connected to different word line than selected memory cells. Similarly, during a reading process, the set of memory cells to be read are referred to as the selected memory cells while the memory cells that are not intended to be read are referred to as the unselected memory cells.

The three above-described countermeasures can be implemented separately (e.g., only one implemented at a time) or together (such as implementing two or all three of the countermeasures during a common programming process). In one embodiment, a memory system can include the circuits to perform all or any of the three above-described countermeasures and will dynamically choose one to perform during a programming process.

In some embodiments, the countermeasures can be turned on or off by the memory system. For example, the memory system can include a temperature sensor circuit to sense current temperature at the memory system. If the current temperature is below a trigger temperature, then the countermeasure is implemented during the current programming process. If the current temperature is not below the trigger temperature, then the countermeasure is turned off and not implemented during the current programming process.

FIG. 1 is a block diagram of one embodiment of a memory system 100 that implements the proposed technology, including the countermeasures for avoiding program disturb discussed herein. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below with respect to FIG. 2. Local high speed volatile memory 140 is used by controller 120 to perform certain functions. For example, local high speed volatile memory 140 stores logical to physical address translation tables ("L2P tables.")

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
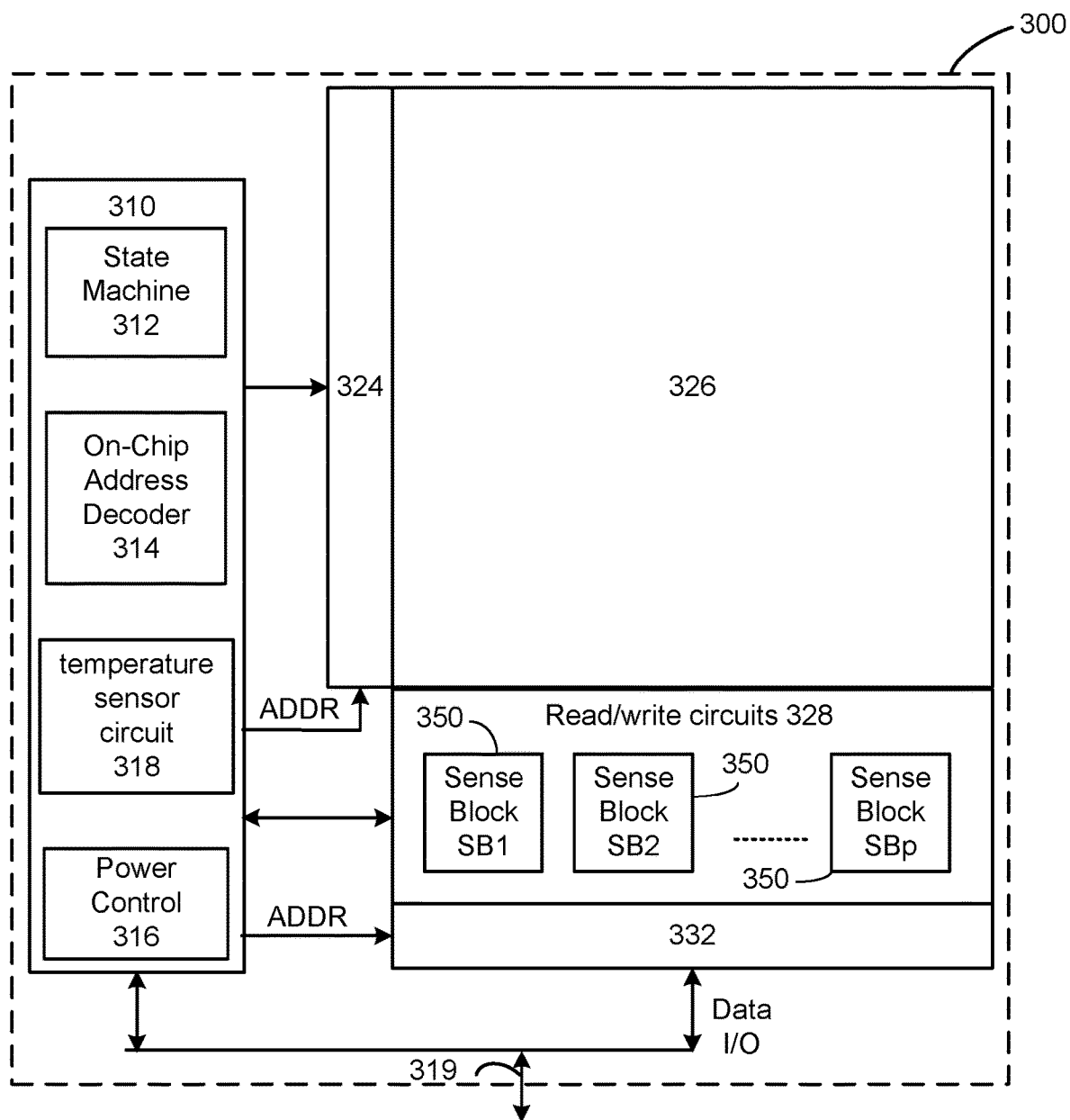
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise a control circuit for memory structure 326. In other embodiments, other circuits that support and operate on memory structure 326 can be referred to as a control circuit. For example, in some embodiments, the controller can operate as the control circuit or can be part of the control circuit.

For purposes of this document, control circuitry 310, read/write circuits 328, and decoders 324/332 comprise peripheral circuits for memory structure 326, as they are not part of memory structure 326 but are on the same die as memory structure 326 and are used to operate memory structure 326.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
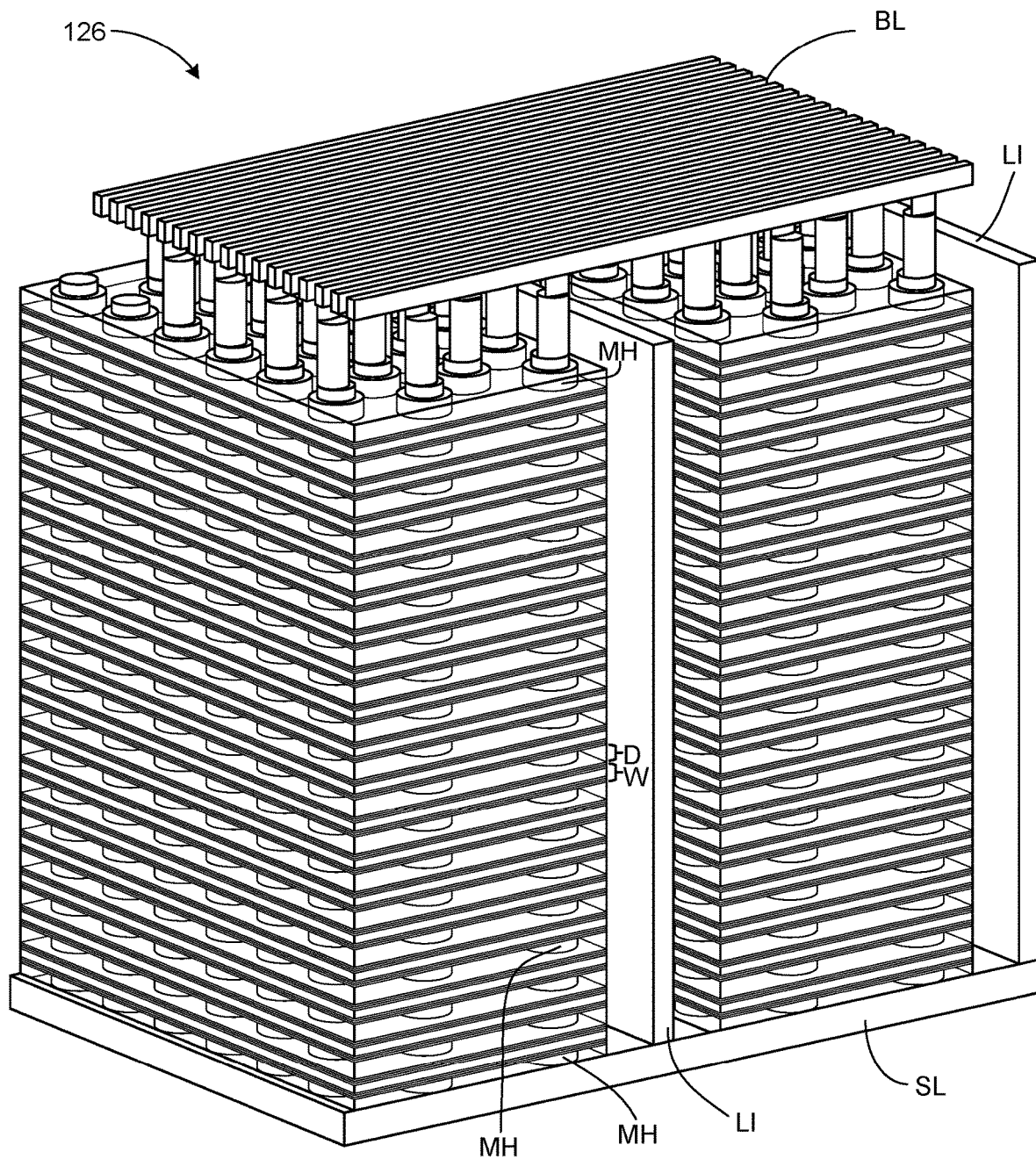
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
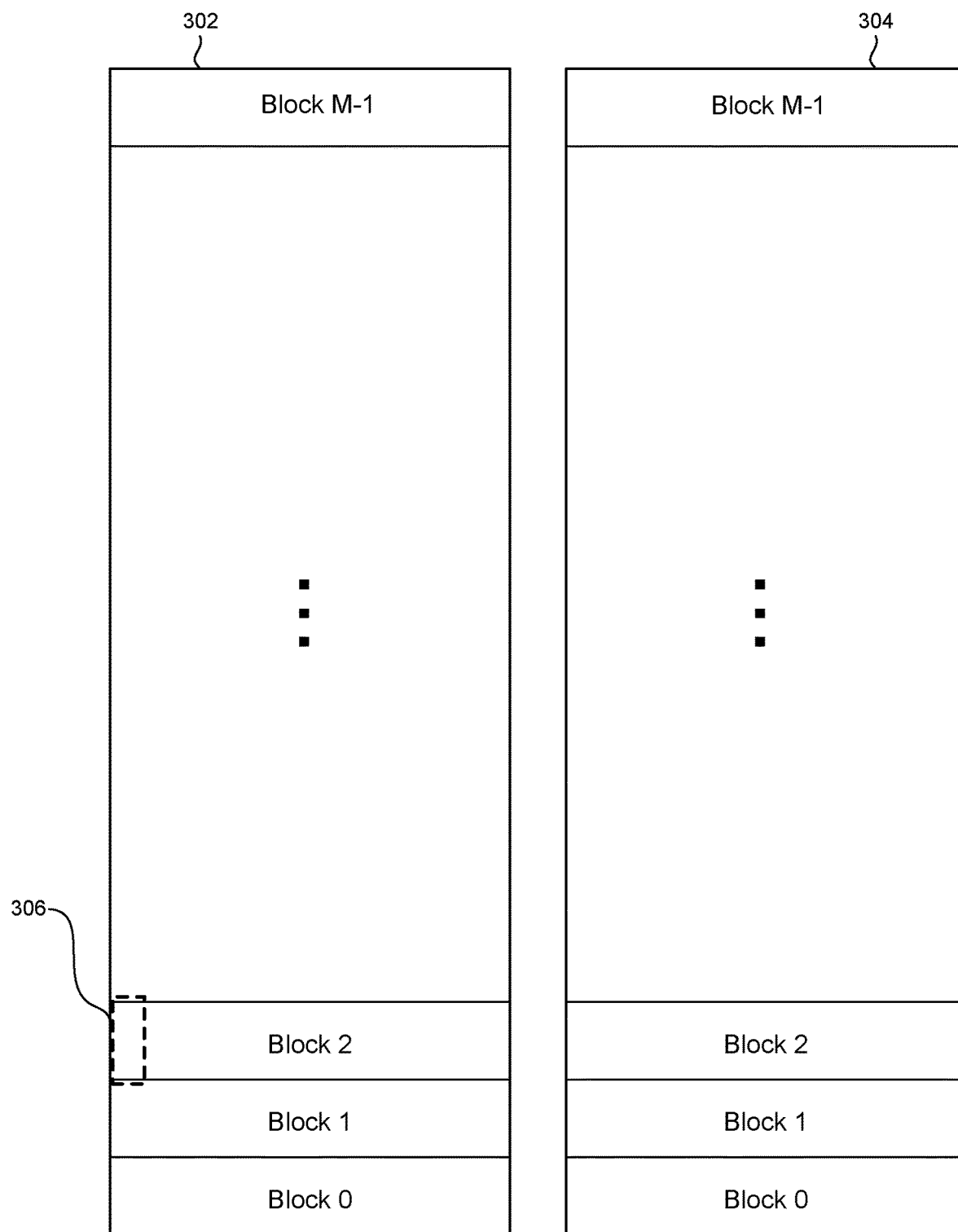
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
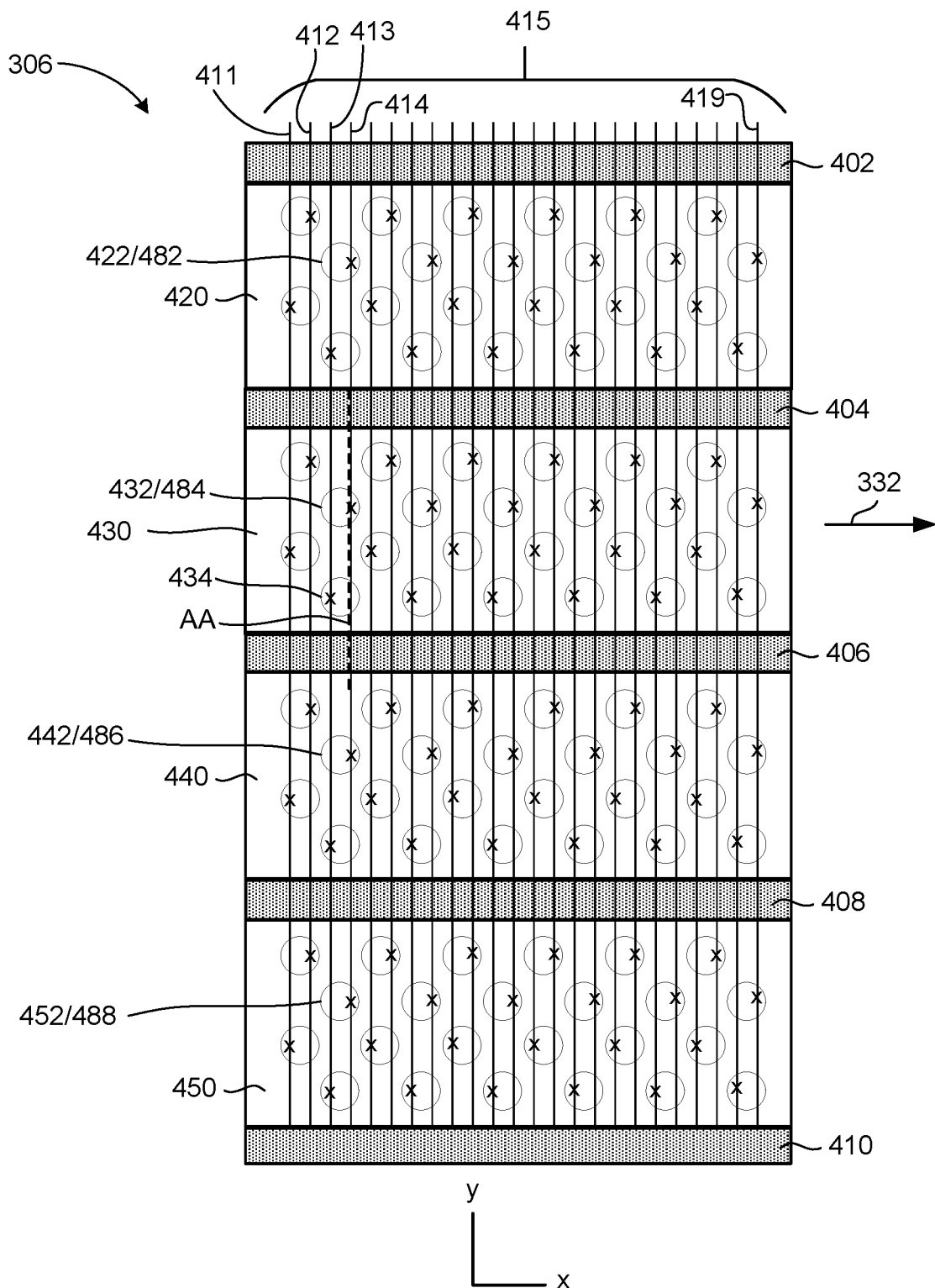
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
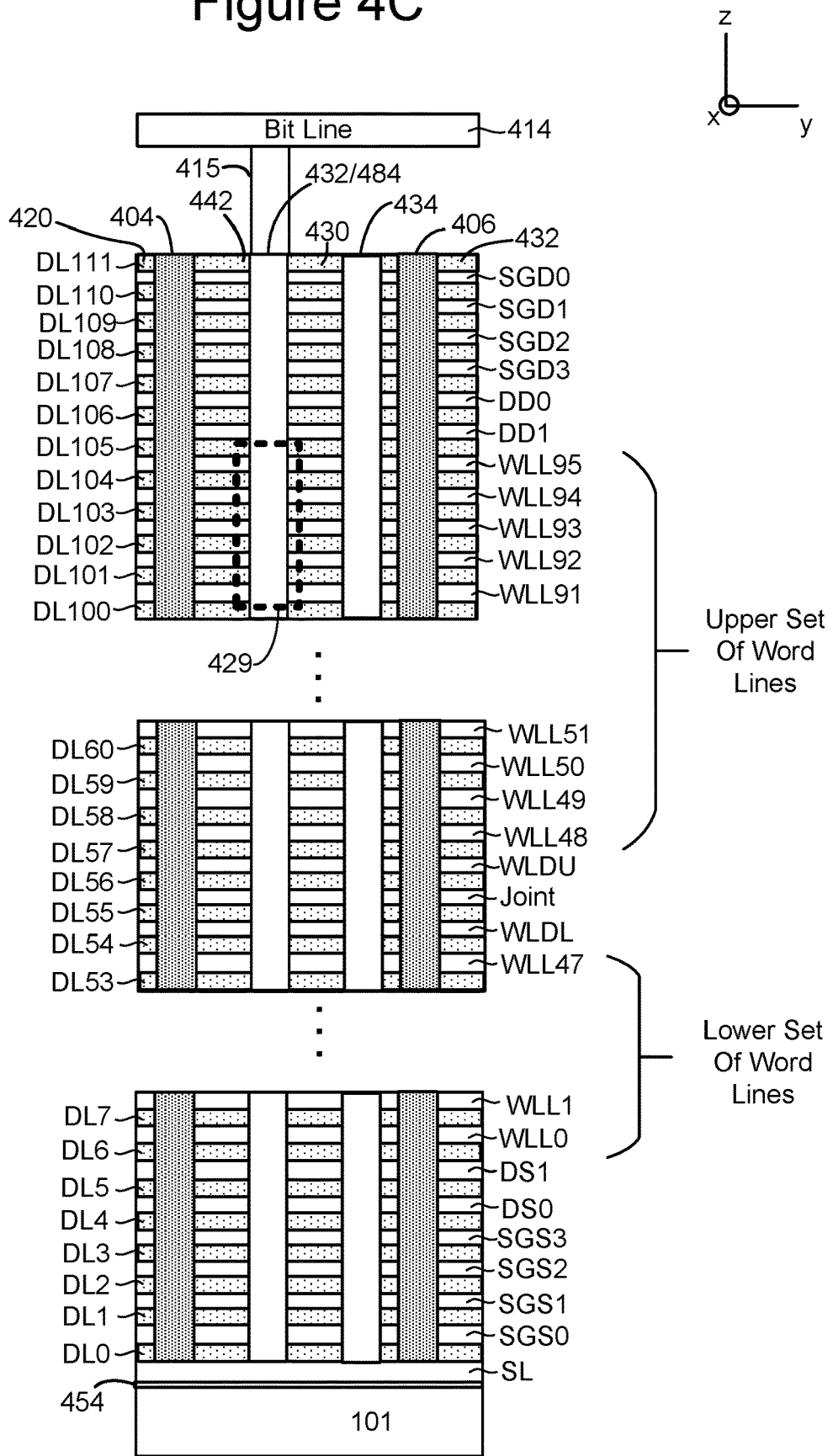
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
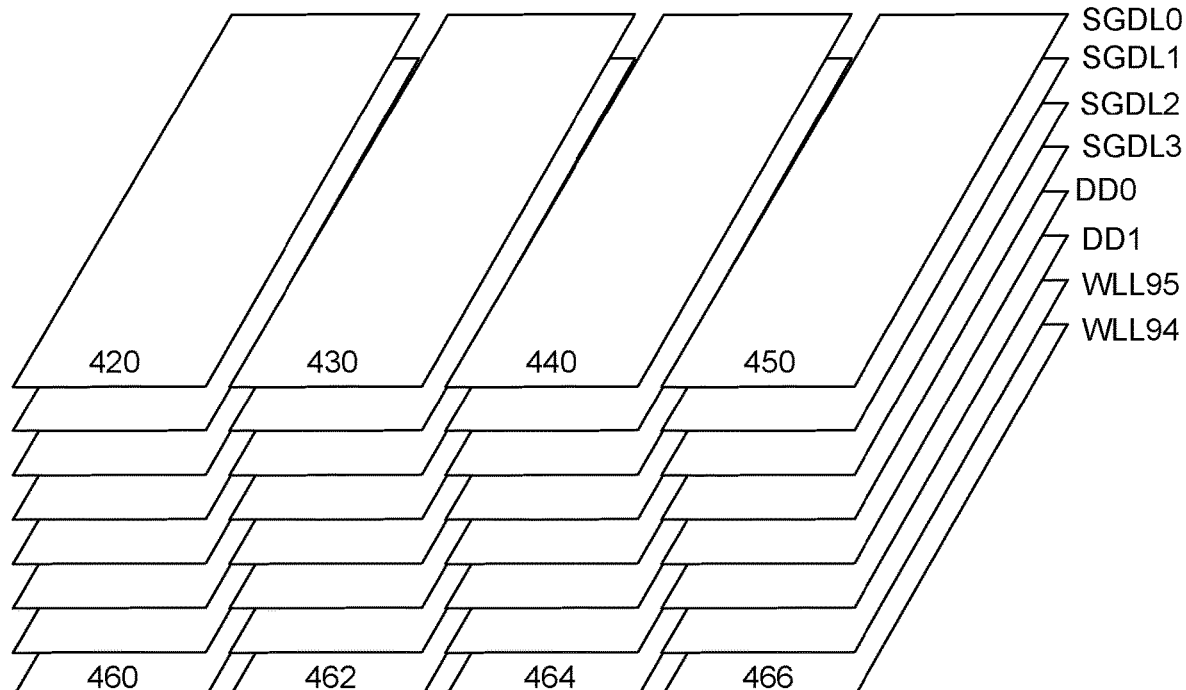
FIG. 4D depicts a view of the select gate layers and word line layers.
Figure 4D:
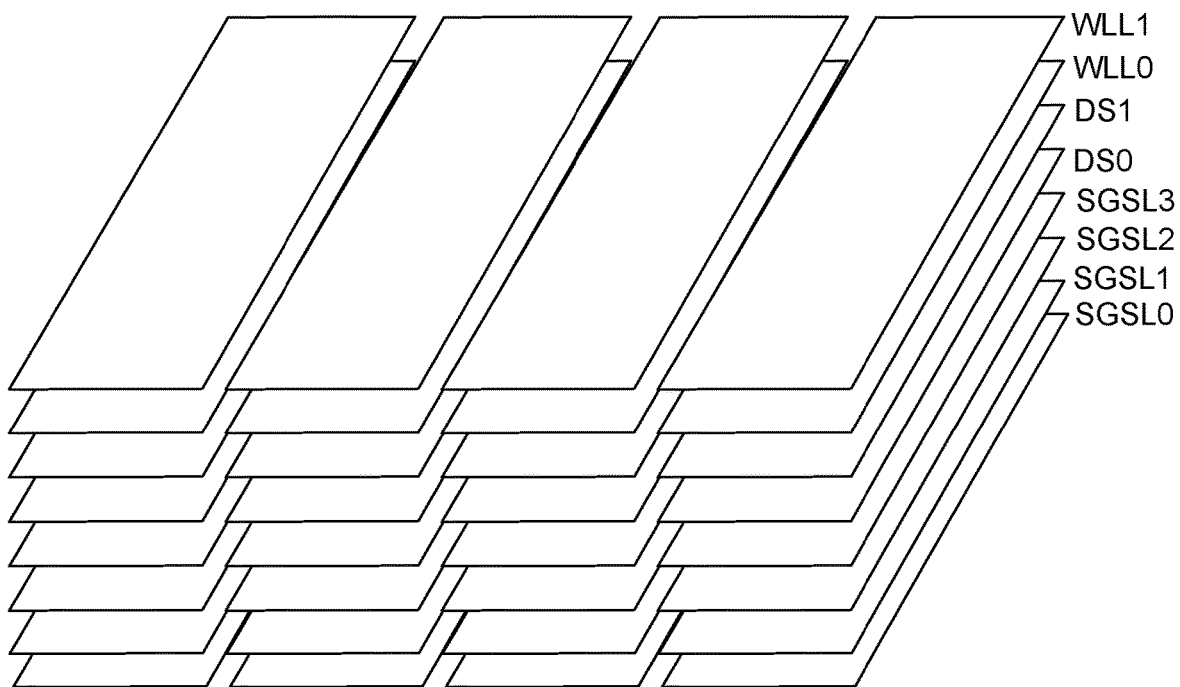

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
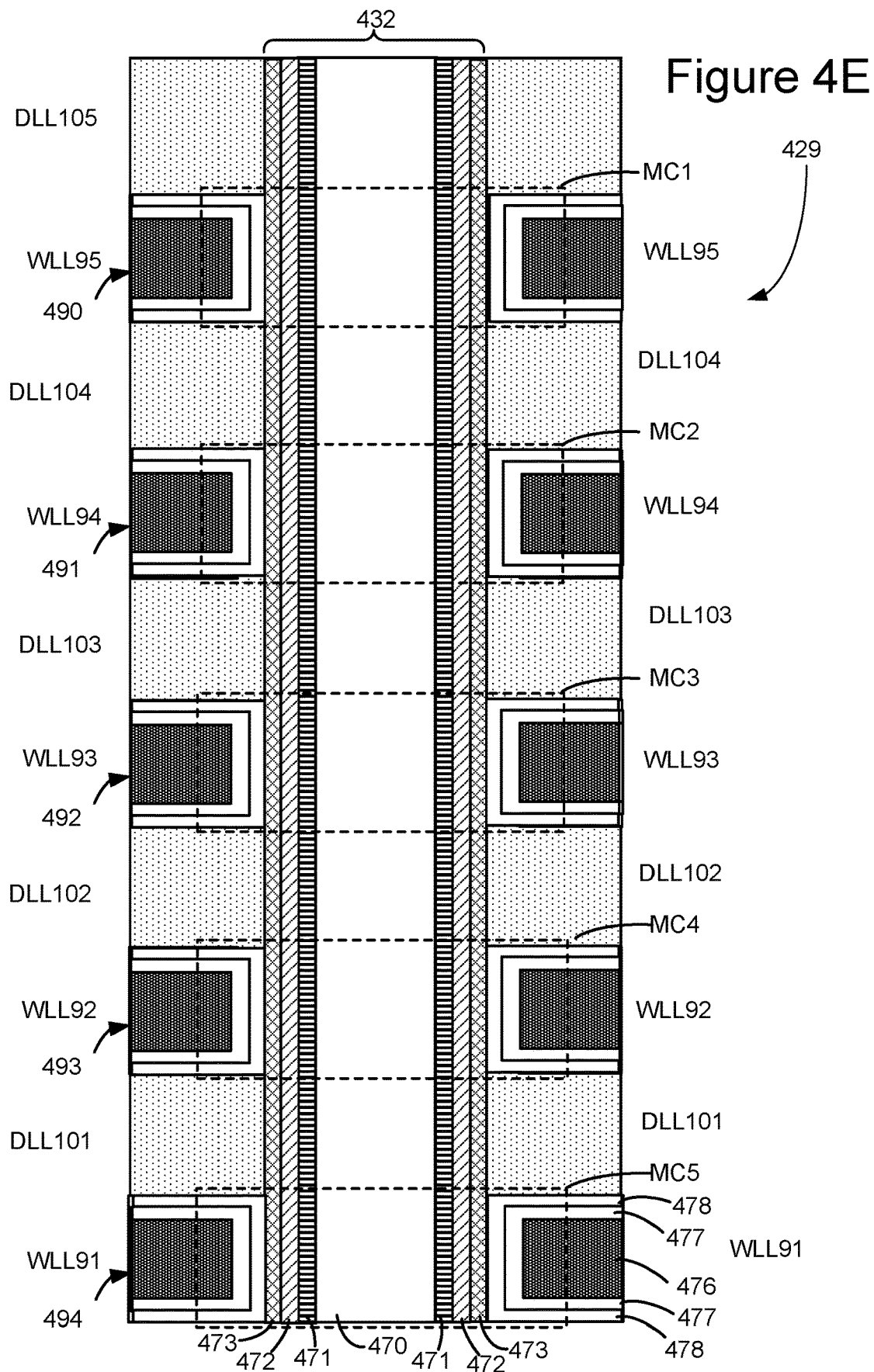
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
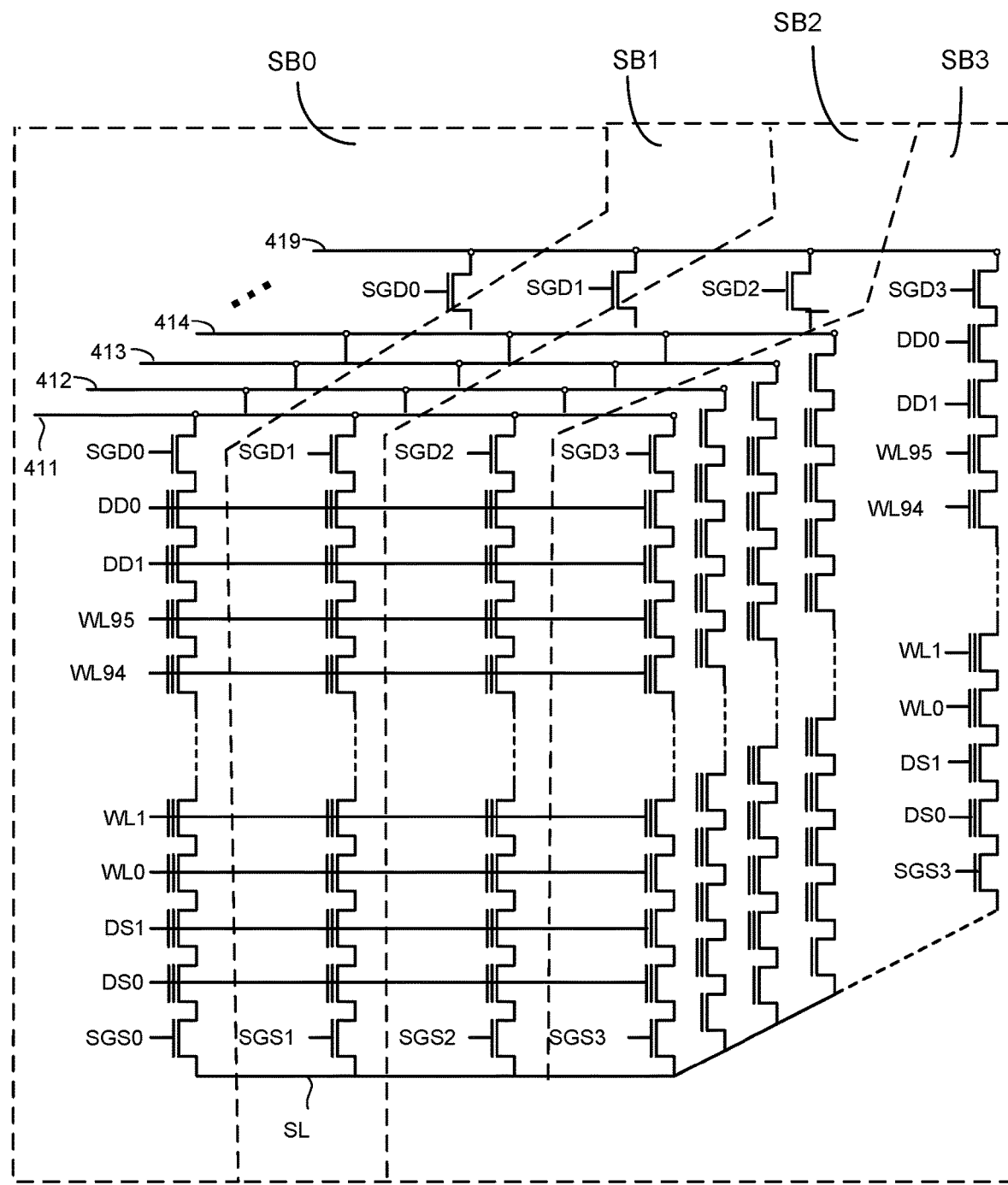
FIG. 4F is a schematic of a plurality of NAND strings showing multiple sub-blocks.

FIG. 4F is a schematic diagram of a portion of the memory depicted in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4G:
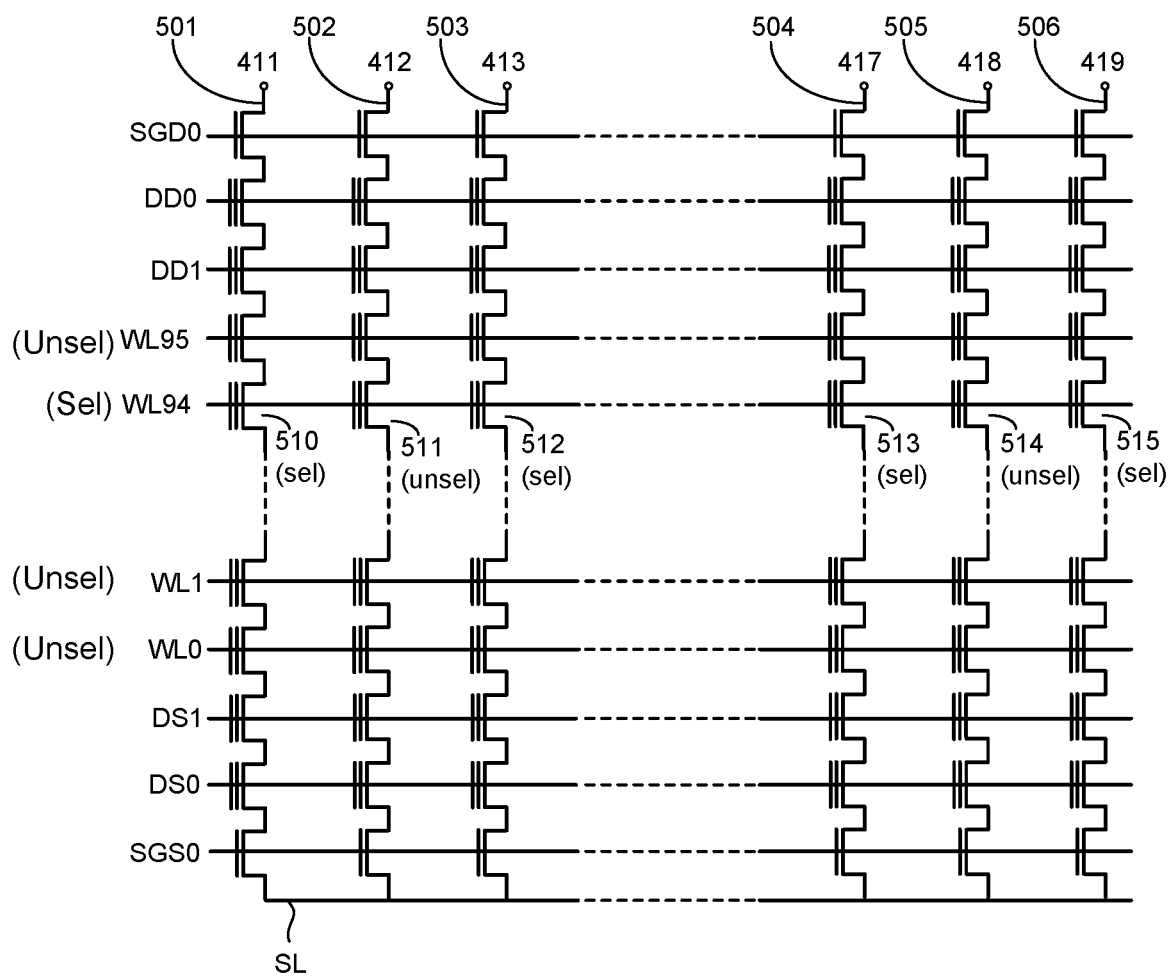
FIG. 4G is a schematic of a plurality of NAND strings showing one sub-block.

FIG. 4G is a schematic of sub-block SB0. However, sub-blocks SB1, SB2 and SB3 have similar structures. FIG. 4G shows physical word lines WL0-WL95 running across the entire sub-block. All of the NAND strings of Sub-block S0 are connected to SGD0 and SGS0. FIG. 4G only depicts six NAND stings 501, 502, 503, 504, 505 and 506; however, sub-block SB0 will have thousands of NAND strings (e.g., 15,000 or more).

To better understand the concept of selected memory cells and unselected memory cells, assume a programming operation is to be performed and, for example purposes only, that word line WL94 and sub-block S0 are selected for programming. That means that all of the memory cells connected to WL94 that are in sub-blocks SB1, SB2 and SB3 (the other sub-blocks) are unselected memory cells. Some of the memory cells connected to WL94 in sub-block S0 are selected memory cells and some of the memory cells connected to WL94 in sub-block S0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled unsel in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figures 5, 6:
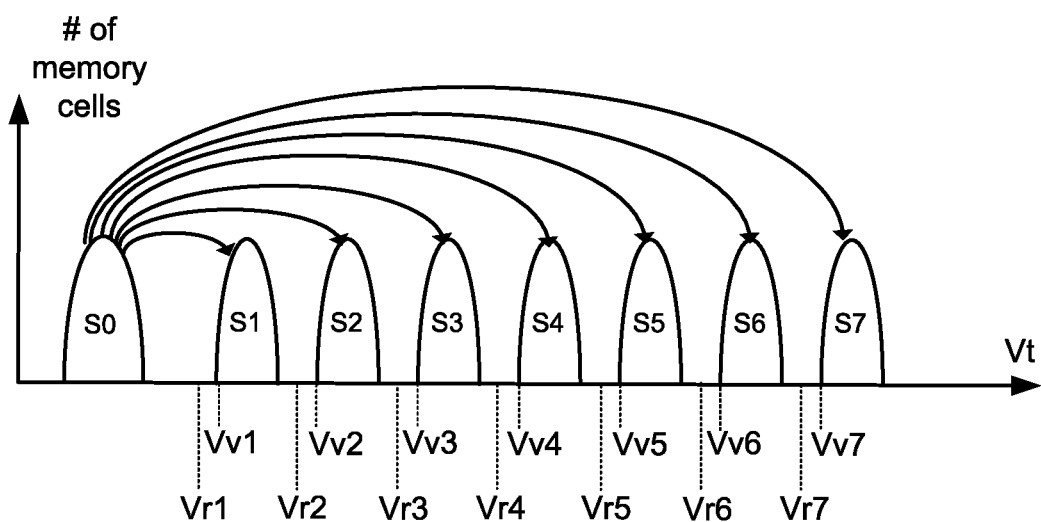
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on error correction to identify the correct data being stored.

FIG. 6 is a table describing one example of an assignment of data values to data states. In the table of FIG. 6, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

Figure 7:
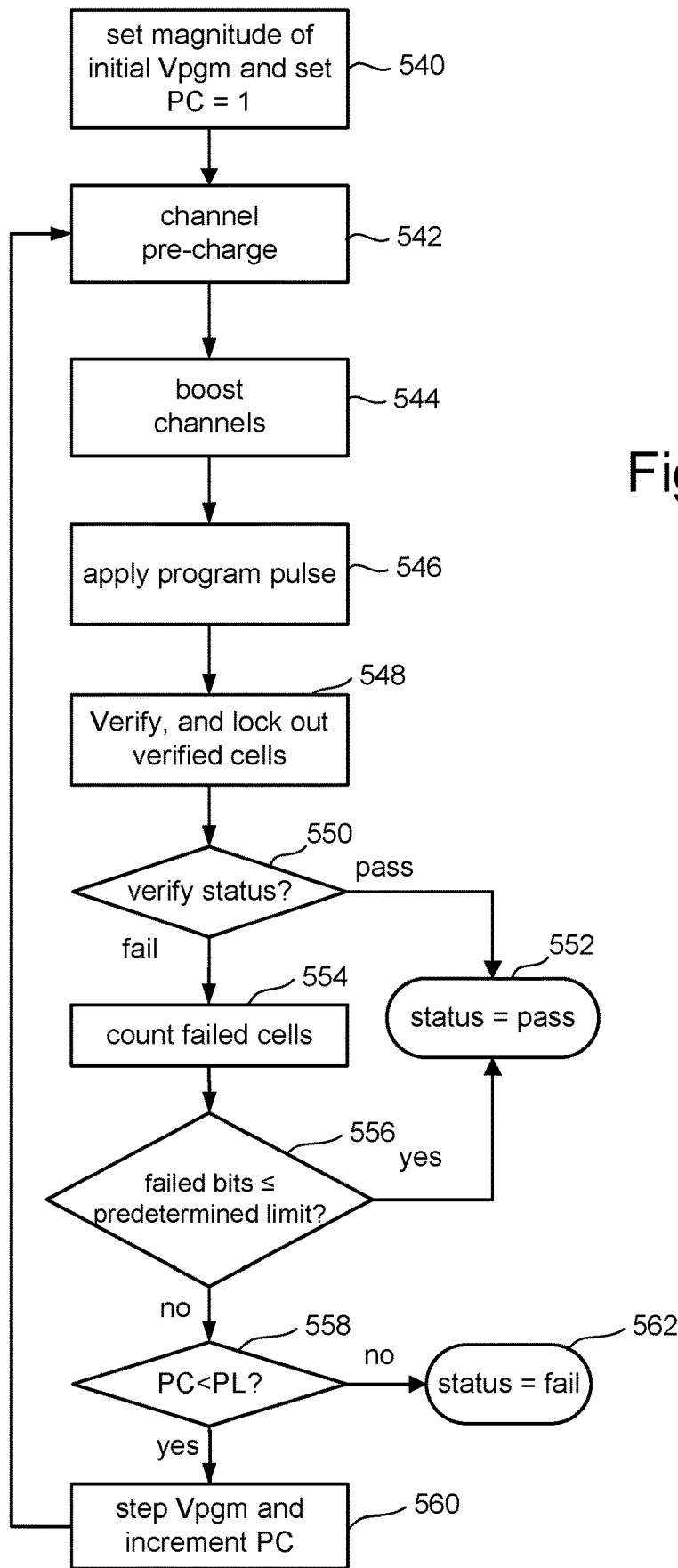
FIG. 7 is a flow chart describing one embodiment of a process for programming non-volatile memory.

FIG. 7 is a flowchart describing one embodiment of a process for programming. In one example embodiment, the process of FIG. 7 is performed on memory die 300 using the control circuit discussed above. For example, the process of FIG. 7 can be performed at the direction of state machine 312. The process of FIG. 7 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 540 of FIG. 7, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to stare data associated with state S0 so they will not be programmed. Additionally, as memory cells reach their intended target data state, they will be inhibited from further programming. Those NAND strings that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, only the drain side of the channel is pre-charged. By "drain side" it is meant the portion of the NAND string on the drain side of the selected word line.

In step 544, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes known in the art.

In step 546, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming. In step 546, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 546, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 548, it is determined whether all the memory cells have reached their target threshold voltages (pass). If so, the programming process is complete and successful because all selected memory cells were programmed and verified to their target states. A status of "PASS" is reported in step 552. If, in 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allows for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 558 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 560, the process loops back to step 542 and another program pulse is applied to the selected word line so that another iteration (steps 542-560) of the programming process of FIG. 7 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
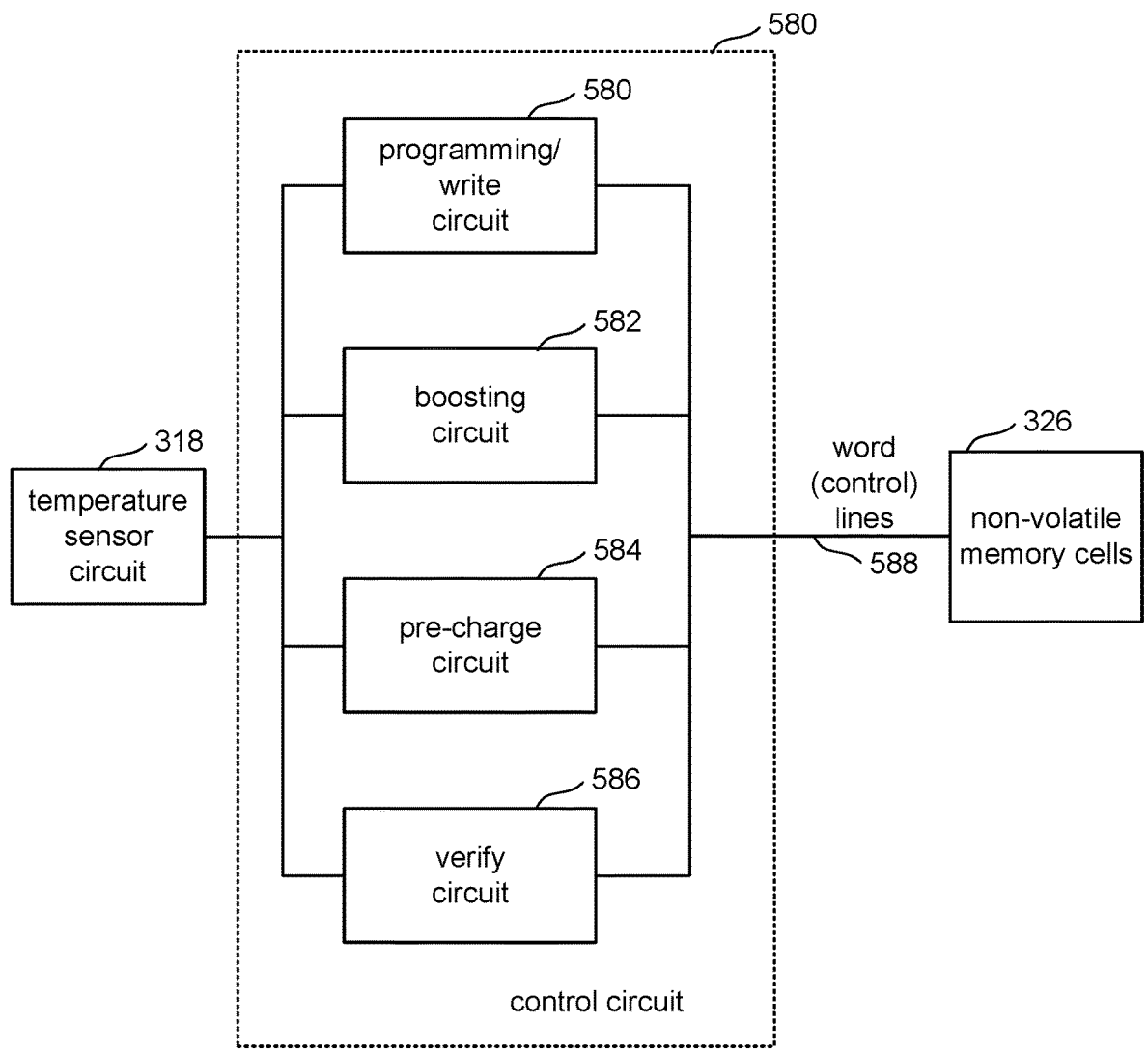
FIG. 8 is a logical block diagram depicting various circuits used to perform the process of FIG. 7.

FIG. 8 is a logical block diagram depicting various electrical circuits used to perform the process of FIG. 7. In one embodiment, all of the circuits depicted in FIG. 8 are resident on the memory die 300. In other embodiments, one or more of the circuits are located off the memory die, such as (for example) on controller 120 or elsewhere. FIG. 8 shows programming circuit (or write circuit) 580, boosting circuit 582, pre-charge circuit 584 and verify circuit 586 all connected to word lines 588 and temperature sensor circuit 318. Word lines 588, which correspond to WL0-WL95 discussed above, are connected to non-volatile memory cells of memory structure 326. Therefore, circuits 580-586 are connected to the non-volatile memory cells of memory structure 326. In one embodiment, programming circuit (or write circuit) 580, boosting circuit 582, pre-charge circuit 584 and verify circuit 586 together form control circuit 590, which can be part of control circuitry 310 or controller 120. In one embodiment, circuits 580-586 are part of state machine 312 (or a microcontroller). Programming circuit 580 performs programming (writing) on the non-volatile memory cells of memory structure 326, including applying the program pulse in step 546 and performing steps 540 and 558-562 of FIG. 7. Boosting circuit 582 performs the boosting of the channels of unselected NAND strings, including applying the boosting signals during step 544 of FIG. 7. Pre-charge circuit 584 performs the pre-charging of the channels of unselected NAND strings, including applying the pre-charge signals during step 542 of FIG. 7. Verify circuit 586 performs the program verify process of steps 548-556 of FIG. 7, including managing the Sense Blocks 350 (see FIG. 2).

Program disturb is a condition that includes the unintended programming of one or more locations in a memory while performing a programming process for other locations in the memory. Such unintended programming can cause an error in the data being stored. In some cases, program disturb can result from electrons trapped in the channel being accelerated from one side of a selected word line to another side of the selected word line and redirected into the selected word line. This phenomena is depicted in FIGS. 9A-C.

Figure 9A:
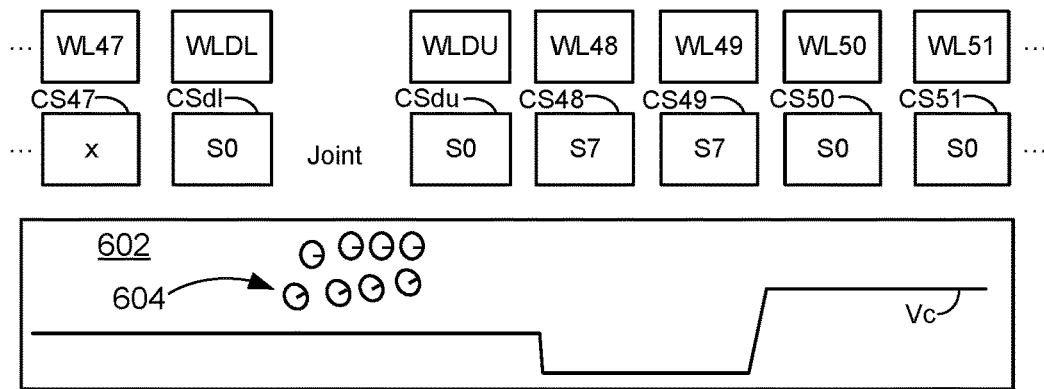
FIGS. 9A-C show a cross section of an unselected NAND string.

FIG. 9A depicts a portion of an unselected NAND string. An unselected NAND string is a NAND string that has a memory cell that is both connected to the selected word line and is to be inhibited from programming. The NAND string of FIG. 9A is connected to word lines WL0-WL95; however, only WL47-WL50 are depicted in the drawing. FIG. 9A also shows a portion of the channel. FIGS. 9B and 9C depict the same NAND string as FIG. 9A, at different moments in time.

Figure 9B:
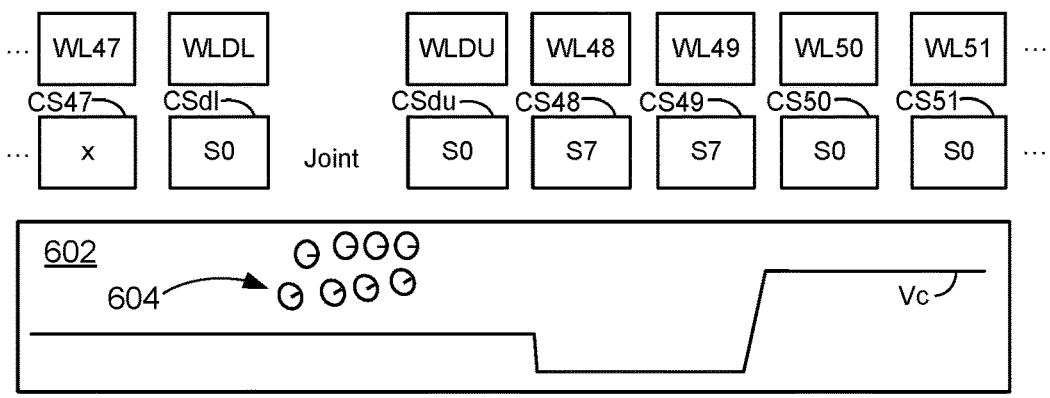
Figure 9C:
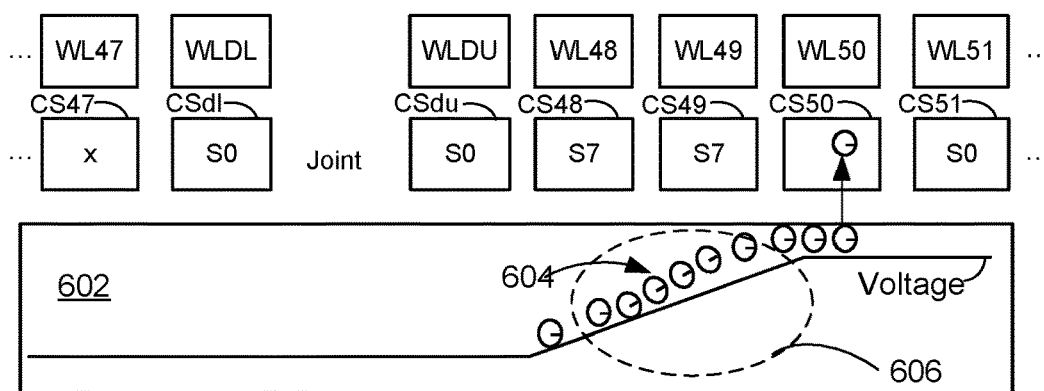

FIGS. 9A-C illustrate an example where word line WL50 is the selected word line, meaning that memory cells connected to word line WL50 are selected to be programmed. Word lines WL0-WL49 are on the source side of word line WL50, as WL0 is closest to the source line. Word lines W51-95 are on the drain side of word line WL50, as WL95 is closest to the bit line. In this example, the memory cells are programmed in word line order WL0, WL1, WL2, . . . , WL95. Therefore, in relation to WL50, word lines WL0-WL49 are already programmed word lines. Since WL0-WL49 are not selected for programming, then WL0-WL49 are already programmed unselected word lines (or programmed unselected word lines) and are on the programmed side of WL50. For purposes of this document, the phrase "already programmed" means that the memory cells connected to the word line have experienced a programming process, even though some of the memory cells were inhibited from programming (and, therefore, were not programmed). In relation to WL50, word lines WL51-WL95 are not yet programmed word lines. Since WL51-WL95 are not selected for programming, then WL51-WL95 are not yet programmed unselected word lines and are on the unprogrammed side of WL50. For purposes of this document, the phrase "not yet programmed" means that the memory cells connected to the word line have not experienced a programming process or not yet completed a programming process. A dummy word line cannot be programmed or already programmed since a dummy word line is connected to dummy memory cells that are not eligible to store host data.

FIGS. 9A-C show the charge storage regions CS47, CSdl, CSdu, CS48, CS49, CS50, CS51 for a portion of an example unselected NAND string of memory structure 326. Charge storage region CS47 is connected to word line WL47. Charge storage region CSdl is connected to dummy word line WLDL. Charge storage region CSdu is connected to dummy word line WLDLU. Charge storage region CS48 is connected to word line WL48. Charge storage region CS49 is connected to word line WL49. Charge storage region CS50 is connected to word line WL50. Charge storage region CS51 is connected to word line WL51.

In the example of FIGS. 9A-C, charge storage region CS51 is still in the erased state S0 because WL51 has not yet received programming. Charge storage region CS50 is still in the erased state S0 as WL50 is selected for programming and is in the process of being programmed. However, the memory cell associated with charge storage region CS50 is to remain in the erased state S0; therefore, it is not selected for programming as it is to be inhibited during the current programming process. In the example of FIGS. 9A-C, the memory cells associated with charge storage regions CS48 and CS49 are already programmed to state S7, the data state with the highest threshold voltages. For purposes of this example, it does not matter what state the memory cell associated with charge storage region CS47 is in.

Due to the application of voltages to the word lines (which are one example of control lines) during a previous program verify process, charge 604 has accumulated in the channel 602 of the unselected NAND string, as depicted in FIG. 9A. Because CS48 and CS49 are in the data state with the highest threshold voltages, the two associated memory cells shut off earlier than if the memory cells had lower threshold voltages, thereby cutting off the channel; 602 and trapping the charge 604 in the source side of the channel (with respect to the selected word line). FIG. 9A also shows the voltage Vc in the channel. As can be seen, the voltage at CS48 and CS49 is at or near 0 volts, thereby cutting off the source side of the channel 602 from the drain side of the channel, which is why the charge 604 is trapped on the source side of the channel. In this example, the Joint area provides additional space for the trapped charge to accumulate.

Looking back at the programming process of FIG. 7, step 542 includes pre-charging the channel. FIG. 9A depicts the drain side of channel 602 pre-charged such that the voltage Vc of the channel is higher on the drain side then on the source side.

FIG. 9B depicts the unselected NAND string during the boosting of the channel of the unselected NAND string (see step 544). As depicted, the voltage Vc of the channel is higher than in FIG. 9A and the differential in voltage between the drain side of the channel and the source side of the channel is even greater during the boosting of FIG. 9B as compared to the pre-charging of FIG. 9A.

FIG. 9C depicts the unselected NAND string while applying the program pulse in step 546. The channel is now open. Due to the voltage differential between the source side of the channel and the drain side of the channel from the boosting, electrons 604 were accelerated from the source side to the drain side of channel 602. Due to the high voltage of the program pulse, the electrons 604 that were accelerated from the source side to the drain side of channel 602 are redirected for injection into the selected word line resulting in the electrons being injected into charge storage region CS50. This is referred to as source side hot electron injection. The injection of the electrons into charge storage region CS50 raises the threshold voltage of the memory cell associated with charge storage region CS50, which is program disturb because the memory cell associated with charge storage region CS50 is supposed to be inhibited from programming.

Figure 10:
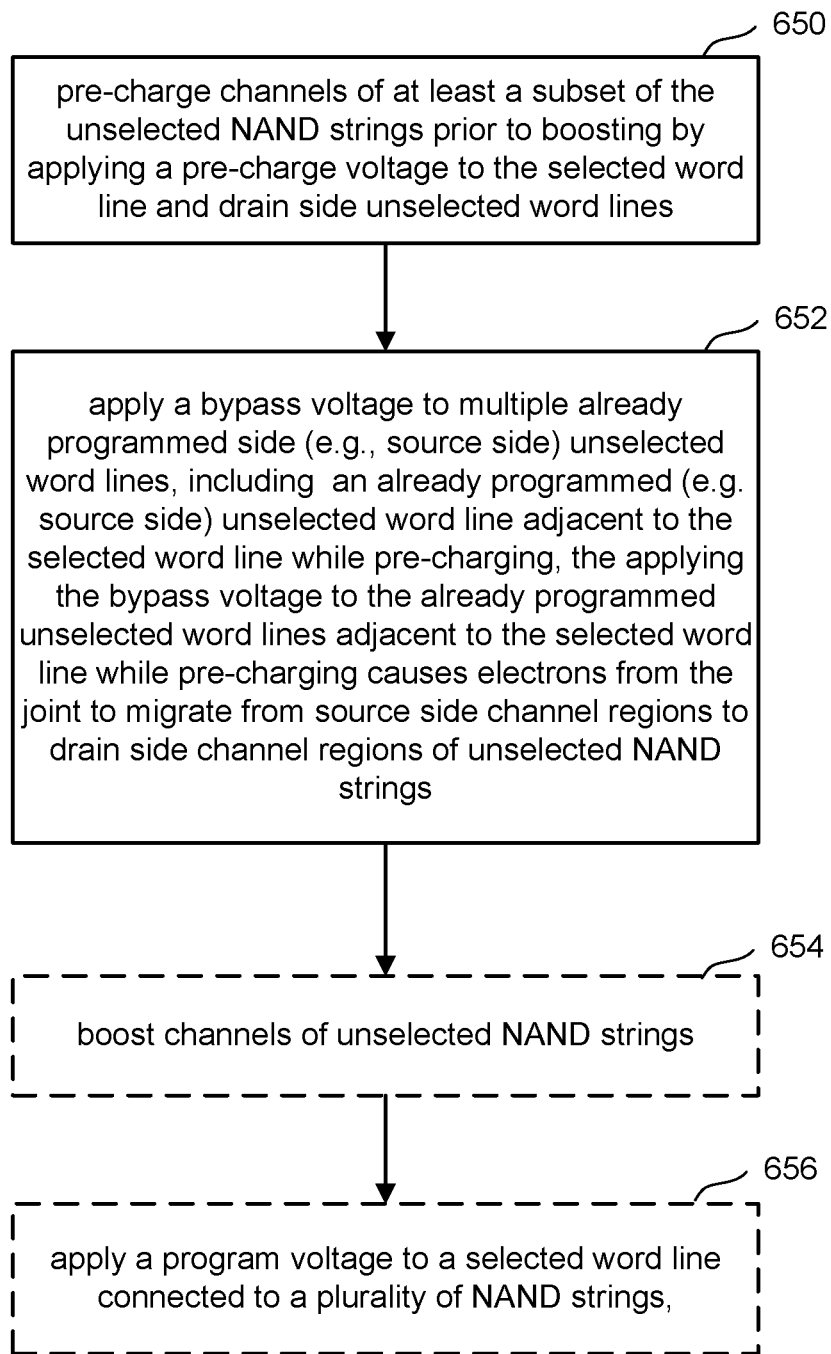
FIG. 10 is a flow chart describing one embodiment of a process for pre-charging.
Figure 11:
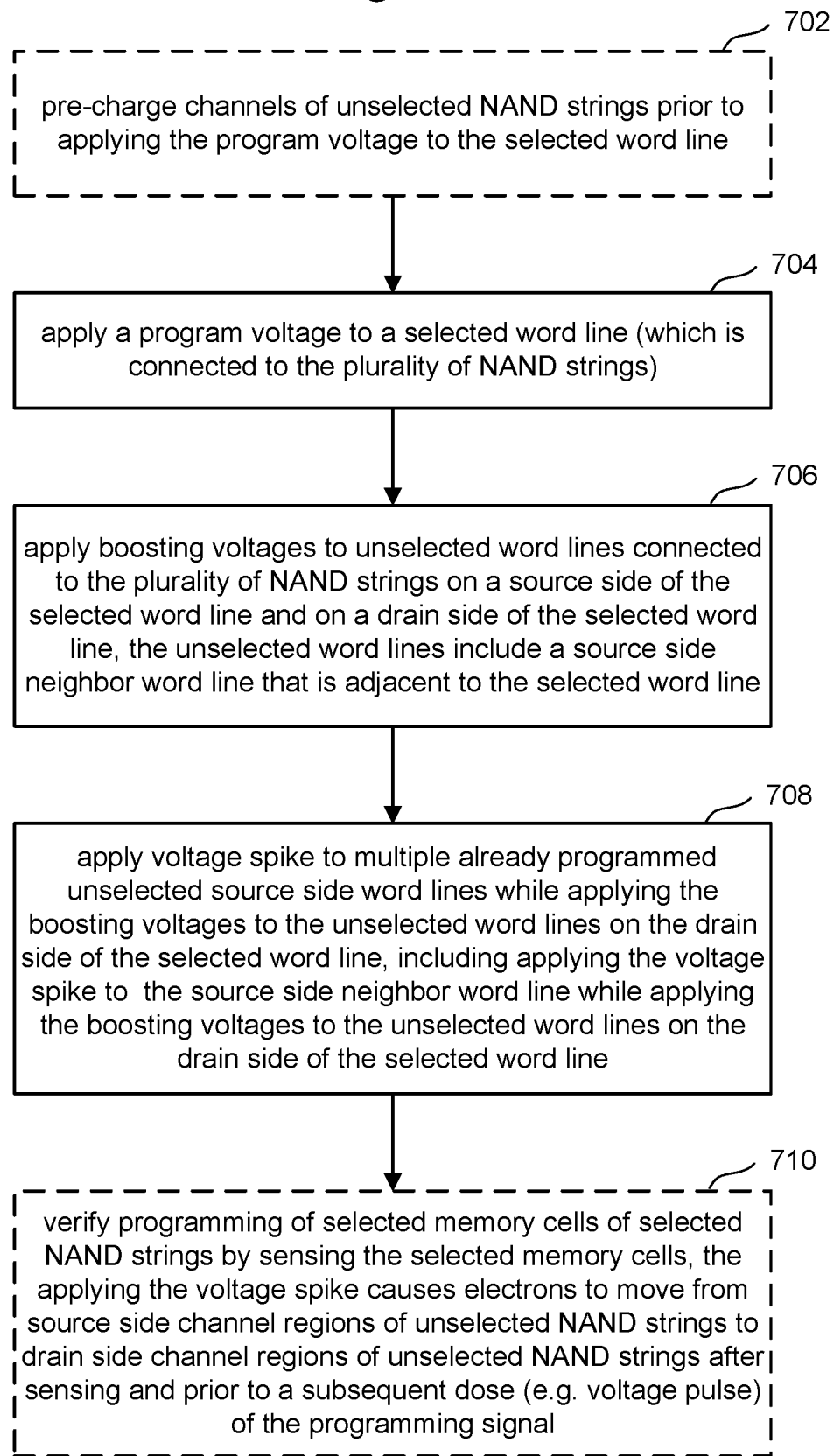
FIG. 11 is a flow chart describing one embodiment of a process for boosting.
Figure 12:
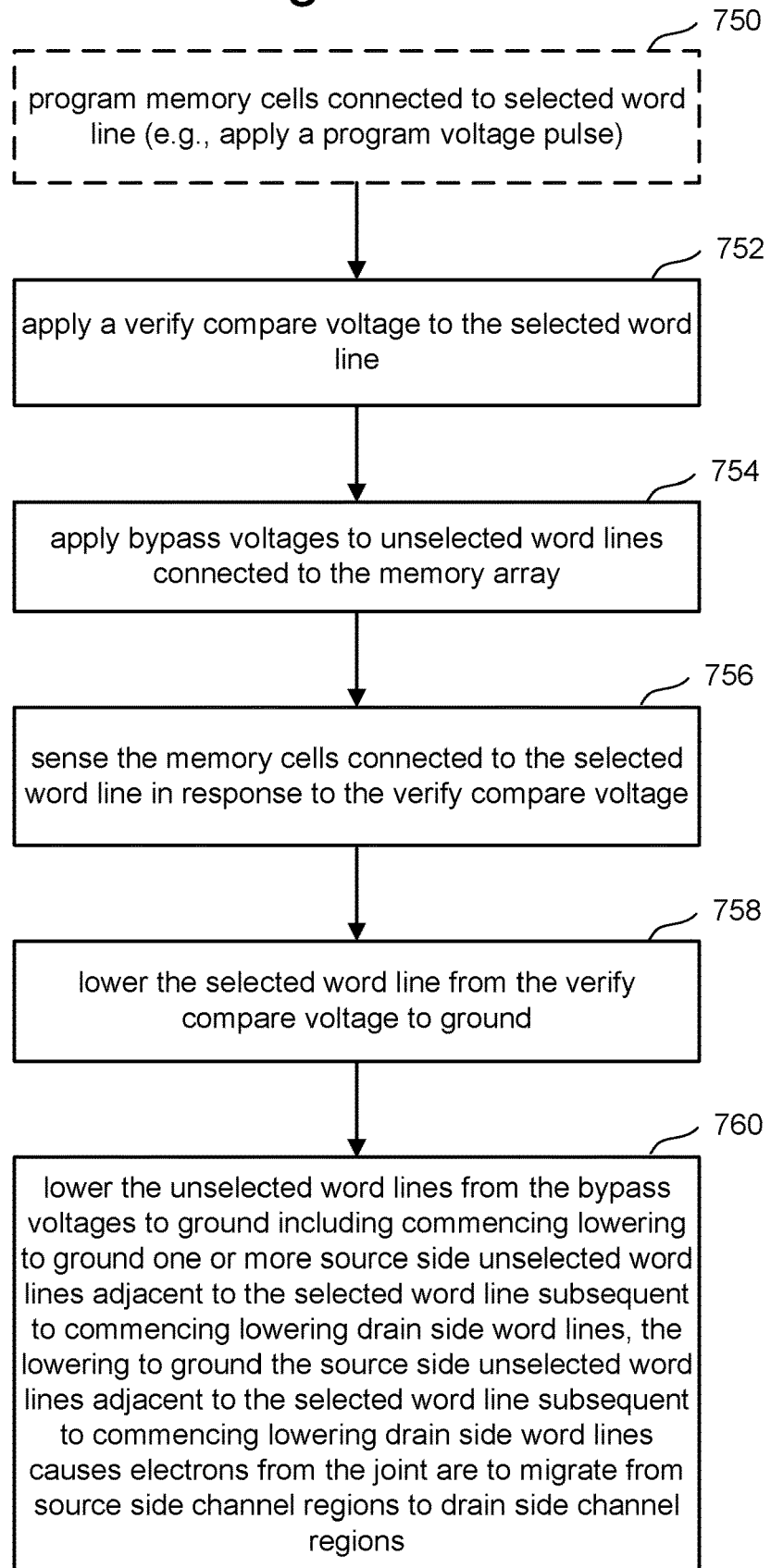
FIG. 12 is a flow chart describing one embodiment of a process for verifying programming.

To prevent the above-described program disturb, countermeasures are proposed in FIGS. 10, 11 and 12 to open the channel from one side of the channel to the other side of the channel (e.g., from the source side of the channel to the drain side of the channel or from the already programmed side to the not yet programmed side) after a sensing operation for program verify and prior to a subsequent programming signal being applied. The opening of the channel puts the two sides of the channel in electrical communication (e.g., allowing electrons to flow there between). Note that FIGS. 10, 11 and 12 provide more details of a portion of FIG. 7.

FIG. 10 is a flow chart describing one embodiment of a process for implementing one proposed countermeasure that includes purging the already programmed side of the channel during a pre-charge operation performed as part of the programming process. As discussed above, one example of program disturb involves acceleration and redirection of electrons. The process of FIG. 10 attempts to separate the acceleration and redirection. The acceleration was caused by a voltage potential difference between the source and drain sides of the channel. Thus, the process of FIG. 10 attempts to remove that potential difference. In one embodiment, the process of FIG. 10 is performed by the components of FIG. 10 or the components of FIG. 2.

The process of FIG. 10 is performed during the programming process. For example, steps 650 and 652 of FIG. 10 are performed as part of step 542 (channel pre-charge) of the programming process of FIG. 7. In step 650, the memory system pre-charges channels of at least a subset of unselected NAND strings (ie channels connected to unselected memory cells), prior to the boosting of step 544 of FIG. 7, by applying one or more pre-charge voltages to the selected word line and drain side unselected word lines. By applying these pre-charge voltages, the voltage of the channel will be raised, which will improve the future boosting. In one embodiment, only the drain side of the channel is pre-charged and the source side of the channel is not pre-charged. To prevent the source side of the channels from being pre-charged, unselected source side word lines receive 0 volts or one or more voltages that are too low to pre-charge and/or too low to turn on memory cells in a highest data state (e.g., data state S7). In other embodiments both the source side and the drain side of the channel are pre-charged by applying pre-charge voltages to drain side unselected word lines and source side unselected word lines. In step 652, the memory system applies a bypass voltage to multiple already programmed side unselected word lines while pre-charging (e.g., while performing step 650) the channels of unselected NAND strings (ie the channels connected to unselected memory cells). In one embodiment the program side unselected word lines are on the source side of the selected word line. The multiple already programmed side unselected word lines include an already programmed (e.g. source side) unselected word line that is adjacent to the selected word line. This already programmed unselected word line that is adjacent to the selected word line is one of the word lines that receives the bypass voltage. In some embodiments, one to three word lines will receive the bypass voltage in step 652. In one embodiment, step 652 is performed concurrently with step 650. The applying the bypass voltage just to the already programmed unselected word lines adjacent to the selected word line while pre-charging causes the electrons that were trapped in the Joint area (see FIG. 9a), or elsewhere in the source side of the channel, to migrate from the source side channel regions to the drain side channel regions of the unselected NAND strings. This migration of electrons equalizes the charge between the source side of the channel and the drain side of the channel so that the differential in charge does not exist (or is reduced), thereby preventing the acceleration of electrons from the source side to the drain side and preventing the injection of those accelerated electrons into the selected word line causing program disturb. Note that the "source side" and "drain side" terms are in relation to the selected word line. In one embodiment, step 650 and 652 are performed by pre-charge circuit 584 and/or control circuit 588 of FIG. 8. In other embodiments, steps 650 and 652 are performed by control circuitry 310, at the direction of state machine 312. In other embodiments, a different control circuit can be used to perform step 650 and step 652.

In step 654 of FIG. 10, following the pre-charging and application of the bypass voltage, the channels for the unselected NAND strings (channels for a subset of the memory cells) are boosted. This corresponds to step 544 of FIG. 7. In step 656 of FIG. 10, the program voltage is applied to the selected word line (which is connected to the plurality of NAND strings). Step 656 corresponds to step 546 of FIG. 7. In one embodiment, step 654 is performed by boosting circuits 582 and/or control circuit 588. In another embodiment, step 654 is performed by control circuitry 310 of FIG. 2, at the direction of state machine 312. In one embodiment, step 656 of FIG. 10 is performed by programming circuit 580 and/or control circuit 590. In another embodiment, step 656 is performed by control circuitry 310 at the direction of state machine 312. In other embodiments, step 654 and step 656 can be performed by another control circuit.

FIG. 11 is a flow chart describing one embodiment of a process for implementing one proposed countermeasure that includes applying a voltage spike on one or more already programmed unselected word lines adjacent the selected word line during boosting of the not yet programmed side of the channel. In one embodiment, the process of FIG. 11 is performed by the components of FIG. 10 or the components of FIG. 2.

As discussed above, one example of program disturb involves acceleration and redirection of electrons. The process of FIG. 11 attempts to separate the acceleration and redirection. The acceleration was caused by a voltage potential difference between the source and drain sides of the channel. Thus, the process of FIG. 11 attempts to remove that potential difference. In step 702 of FIG. 11, the channels of the unselected NAND strings are pre-charged prior to applying the program voltage to the selected word line. Step 702 of FIG. 11 corresponds to step 542 of FIG. 7 and can be performed by pre-charge circuit 584 and/or control circuit 590. In another embodiment, step 702 can be performed by control circuitry 310 of FIG. 2, at the direction of state machine 312. In another embodiment, step 702 can be performed by another control circuit.

In step 704, the program voltage (e.g. a voltage pulse) is applied to the selected word line, which is connected to the plurality of NAND strings. Step 704 of FIG. 11 corresponds to step 546 of FIG. 7 and step 656 of FIG. 10. In step 706 of FIG. 11, the memory system applies one or more boosting voltages to unselected word lines connected to the plurality of NAND strings on the source side of selected word line and on the drain side of the selected word line. The selected word lines include a source side neighbor word line that is adjacent to the selected word line. In step 708, a voltage spike is applied to multiple already programmed source side word lines while applying the boosting voltages to the unselected word lines on the drain side of the selected word line. This includes applying the voltage spike to the source side neighbor word line while applying the boosting voltages to the unselected word lines on the drain side of the selected word line. In one embodiment, step 708 includes only providing the voltage spike to the source side neighbor word line. In other embodiments, the voltage spike is applied to 2, 3, 4, etc. source side word lines. In one embodiment, steps 706 and 708 are performed by boosting circuit 582 and/or control circuit 590. In other embodiments, steps 706 and 708 (which are analogous to step 544 of FIG. 7) are performed by control circuitry 310 of FIG. 2, at the direction of state machine 312. In another embodiment, step 706 and 708 can be performed by another control circuit. Applying the voltage spike of step 708 opens the channel (i.e. creates electrical communication through the channel), which allows electrons to move from the source side channel regions of unselected NAND strings to the drain side channel regions of unselected NAND strings after sensing and prior to the subsequent dose (e.g. voltage pulse) of the programming signal.

In step 710 of FIG. 11, the memory system verifies programming of the selected memory cells of the selected NAND strings by sensing the selected memory cells. Step 710 of FIG. 11 corresponds to step 548 of FIG. 7. In one embodiment, step 710 (and step 548) is performed by verify circuit 586 and/or control circuit 590. In other embodiments, step 710 (and step 548) is performed by control circuitry 310, at the direction of state machine 312. Another control circuit can also be used to perform step 710. The process of FIG. 11 is one example of how the boosting circuit is configured to boost voltage of the channel and apply a voltage spike to one or more programmed unselected word lines adjacent to the selected word line while boosting the voltage of the channel.

FIG. 12 is a flow chart describing one embodiment of a process for implementing one proposed countermeasure that includes delaying the lowering of voltages of one or more already programmed unselected word lines adjacent the selected word line at the conclusion of a program verify process. In one embodiment, the process of FIG. 12 is performed by the components of FIG. 10 or the components of FIG. 2. The process of FIG. 12 attempts to avoid program disturb by keeping the source side channel clean at the end of the program verify. That is, the process of FIG. 12 attempts to prevent the electrons from accumulating in the source side of the channel area 602.

In step 750 of FIG. 12, the memory system programs memory cells connected to the selected word line by applying a program voltage pulse to the selected word line. Step 750 of FIG. 12 corresponds to step 546 of FIG. 7.

Step 752-760 of FIG. 12 include performing the verify process to determine whether the memory cells selected for programming have reached their target threshold voltage. Thus, steps 752-760 are an example implementation of step 548 of FIG. 7. In one embodiment, steps 752-760 are performed by verify circuit 586 and/or control circuit 590. In another embodiment, steps 752-760 are performed by control circuitry 310, at the direction of state machine 312 as well as the appropriate sense blocks 350 (see FIG. 2). In other embodiments, steps 752-760 are performed by another control circuit. In step 752 of FIG. 12, the memory system applies a verify compare voltage to the selected word line. The verify compare voltages were depicted and described above with respect to FIG. 5 (e.g. Vv1, Vv2, Vv3, Vv4, Vv5, Vv6, and Vv7). In one embodiment, step 752-760 are performed multiple times for different verify compare voltages to account for verifying different data states. In step 754, one or more bypass voltages are applied to the unselected word lines. These bypass voltages cause the unselected memory cells to turn on so that the current through the NAND strings will be determined by the selected memory cell. In step 756, the selected memory cells are sensed. These are the memory cells connected to the selected word line, and they are sensed in response to the verify compare voltage applied in step 752. In step 758, the selected word line is lowered from the verify compare voltage to ground. In step 760, the memory system lowers the unselected word lines from the bypass voltages to ground including commencing lowering to ground one or more source side (e.g., already programmed) unselected word lines adjacent to the selected word line subsequent to commencing lowering drain side (e.g., not yet programmed) word lines. The lowering to ground of the source side unselected word lines adjacent to the selected word line subsequent to commencing lowering drain side word lines allows electrons from the Joint area to migrate from source side channel regions to drain side channel regions.

Various embodiments include the delaying of the voltage ramp down on two or more already programmed (e.g., source side) unselected word (or control) lines which are consecutive (i.e. adjacent), delaying the voltage ramp down for the source side neighbor unselected word (or control) line in comparison to drain side and source side unselected word lines (or control lines), the delayed ramp down of voltage for word lines on a drain side of the Joint area, delaying the voltage ramp down for the source side neighbor unselected word (or control) line which has another source side data word line between it and the source side, and/or that the source side neighbor unselected word (or control) line that has its voltage ramp down delayed changes as the selected word line changes.

Figure 13:
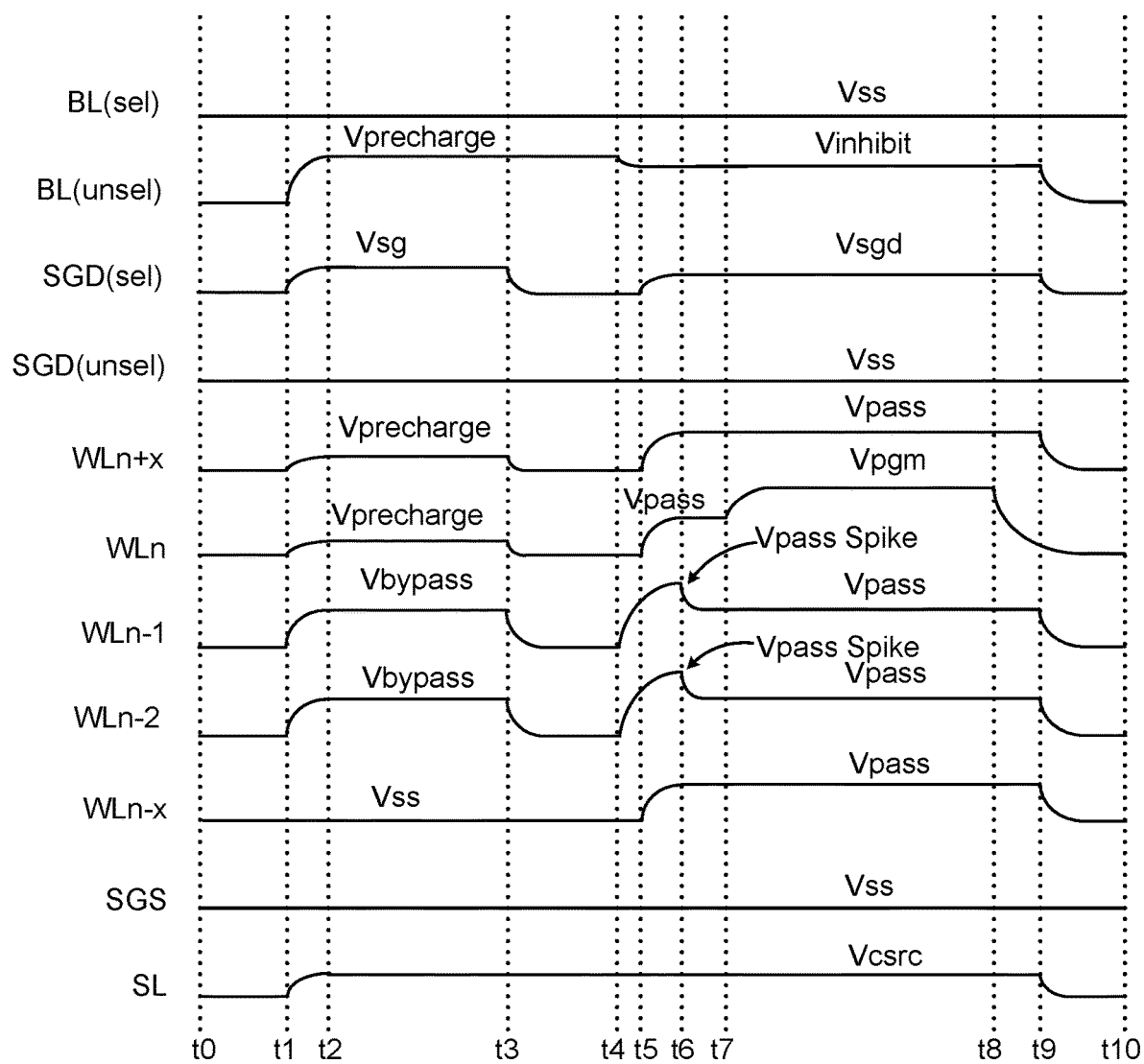
FIG. 13 is a signal diagram describing the behaviors of various signals during pre-charge, boosting and programming.

FIG. 13 is a signal diagram depicting the behavior of various signals during pre-charge, boosting and programming. Thus, FIG. 13 shows behavior of signals during steps 542, 544 and 546 of FIG. 7 as well as during the processes of FIGS. 10 and 11. The signals depicted in FIG. 13 include the selected bit lines BL(sel), unselected bit lines BL(unsel), drain side selection line SGD(sel) for selected sub-blocks, drain side select lines SGD(unsel) for unselected sub-blocks, unselected drain side word lines WLn+x, selected word line WLn, source side unselected neighbor word line WLn−1, next over source side unselected word line WLn−2, other source side unselected word lines WLn−x, source side select lines SGS and source line SL. The selected bit lines BL(sel) are connected to NAND strings that are selected for programming. The unselected bit lines BL(unsel) are connected to NAND strings that are not selected for programming.

At time t0 of FIG. 13, all the depicted signals are at 0 volts. The selected bit line BL(sel), drain side selection line SGD (unsel) for unselected sub-blocks, and the source side select lines SGS are all at 0 volts (Vss) during the entire timeframe depicted in FIG. 13.

The time period of FIG. 13 from t1-t3 corresponds to pre-charging (see step 542 of FIG. 7, steps 650 and 652 of FIG. 10, and step 702 of FIG. 11). At time t1, the source line SL is raised to Vcsrc (e.g. ~2.5-3.5 volts), the unselected bit lines are raised to a pre-charge voltage Vprecharge (e.g., ~2 volts), the drain side select line SGD(sel) connected to selected sub-blocks is raised to Vsg (e.g., ~6 volts), the selected word line WLn is raised to the pre-charge voltage and the drain side unselected word lines WLn+x are raised to the pre-charge voltage to cause pre-charging of the drain side channels of unselected NAND strings. This corresponds to step 650 of FIG. 10 and step 702 of FIG. 11. Also at time t1, already programmed source side unselected word lines WLn−1 and WLn−2 are raised to a bypass voltage Vbypass (e.g., ~6-10 volts), as per step 652 of FIG. 10. The bypass voltage can be the same bypass voltages used during sensing (also referred to as Vread) or the same bypass voltages used during programming (also referred to as Vpass). As used herein, a bypass voltage comprises a voltage of a magnitude sufficient to cause memory cells receiving the bypass voltage to turn on, regardless of which data state the memory cells are programmed (or erased) to. FIG. 13 shows two source side unselected word lines being raised to the bypass voltage Vbypass. In other embodiments, only WLn−1 is raised to the bypass voltage Vbypass or more than two source side word lines are raised to the bypass voltage Vbypass. Raising the source side word lines to the bypass voltage opens up the channel (e.g. electrically couples the two ends of the channel) so that electrons can migrate (electrical communication) from the source side of the channel to the drain side of the channel, which reduces or eliminates the voltage differential between the source side of the channel and the drain side of the channel that may later cause program disturb. In some embodiment, different source side unselected word lines are raised to different bypass voltages. The remaining source side unselected word lines WLn−x remain at Vss (e.g., 0 v). At time t3, SGD(sel), WLn+x, WLn, WLn−1 and WLn−2 are all lowered to ground/Vss. At this point in time the pre-charge process has completed and the drain side of channel of the unselected NAND strings should be pre-charged to a positive voltage.

The time period of FIG. 13 from t4-t10 corresponds to boosting the channels of unselected NAND strings and applying the program signal/pulse (see steps 544 and 546 of FIG. 7, steps 654 and 656 of FIG. 10, and steps 704-708 of FIG. 11). At time t4, the unselected bit lines are lowered from Vprecharge to Vinhibit (e.g. ~1-3.5 volts). At time t5, the drain side selection line SGD(sel) connected to the selected sub-block is raised to Vsgd (e.g., ~3 volts), the selected word line WLn is raised to a boosting voltage Vpass (e.g., 6-10 volts), the drain side unselected word lines WLn+x are raised to the boosting voltage Vpass, and the source side unselected word lines WLn−x are raised to the boosting voltage Vpass. In some embodiments, the source side unselected word lines and the drain side unselected word lines will receive the same boosting voltage Vpass. In other embodiments the source side unselected word lines will receive a boosting voltage that is different from the boosting voltage applied to the drain side unselected word lines; for example, the source side unselected word lines may receive a boosting voltage that is 1-2 volts lower than the boosting voltage applied to the drain side unselected word lines. In some embodiments, each unselected word line will receive a different boosting voltage. Because the bit lines of unselected NAND strings will be at Vinhibit, the select gates will cut off the connected bit line from the channel and the boosting voltages (e.g., Vpass) will cause the channel voltage to increase (boosted). Because channel voltage increases, the differential between the channel voltage and the selected word line will be too small to allow for programming. The applying of the boosting voltage Vpass to WLn+x and WLn−x is the applying of boosting voltages described above with respect to step 706 of FIG. 11.

At time t4 of FIG. 13, a voltage spike is applied to WLn−1 and WLn−2. This voltage spike is labeled as "Vpass Spike." The application of the voltage spike at time t4 corresponds to step 708 of FIG. 11. The voltage spike reaches its peak at time t6. In one embodiment, the maximum voltage for the voltage spike is 1 to 2 volts greater than Vpass. In some embodiments, each of the unselected word lines receiving the voltage spike will receive the same voltage spike while in other embodiments different unselected word lines may receive different voltage spikes. The voltage spike causes the channel to be open between the source and drain sides (electrical communication between the source and drain sides), despite the possibility of the memory cells being in data state S7, thereby, allowing electrons to move from the source side channel regions of unselected NAND strings to drain side channel regions of unselected NAND strings. After time t6, the voltage on WLn−1 and WLn−2 lowers down to the boosting voltage Vpass. At time t7, the voltage applied to the selected word line WLn is raised to the magnitude of the program pulse Vpgm, which can be between 12 and 24 volts. In one embodiment, each successive program pulse is higher in magnitude than a previous program pulse by a step size. The program pulse is applied on WLn from t7-t8, which corresponds to one iteration of step 546 of FIG. 7, step 656 of FIG. 10, and step 704 of FIG. 11.

At time t8, the selected word line WLn is lowered to ground. At time t9, the unselected bit lines BL(unsel), drain side selection line SGD(sel) for selected sub-blocks, unselected drain side word lines WLn+x, selected word line WLn, source side unselected neighbor word line WLn−1, next over source side unselected word line WLn−2, other source side unselected word lines WLn−x, and source line SL are lowered to ground. In one embodiment, the dummy word lines are operated in the same manner as unselected word lines.

In one alternative embodiment, instead of applying a Vpass Spike, or in addition to applying the Vpass Spike, the application of the program pulse (raising WLn to Vpgm) can be delayed so there is a larger gap in time between applying Vpass and applying Vpgm. During that gap, Vpass should cause the source side unselected neighbor word lines to be a high enough voltage to turn on their respective memory cells (regardless of data state) so that the channels will open up and electrons can migrate from the source side of the channels to the drain side of the channels of unselected NAND strings prior to applying Vpgm. Thus, the programming circuit 580 can be configured to apply the programming voltage Vpgm to the selected word line WLn after a non-zero period of time following completion of the voltage spike (Vpass Spike).

FIG. 13 shows the unselected word lines WLn−x and WLn+x being raised from ground to Vpass at time t5. In another embodiment, the unselected word lines WLn−x and WLn+x are first raised to an intermediate voltages (e.g., such as Vdd, which can be 2.5-3.5 v) and then subsequently raised from the intermediate voltage to the final boosting voltage of Vpass.

Figure 14:
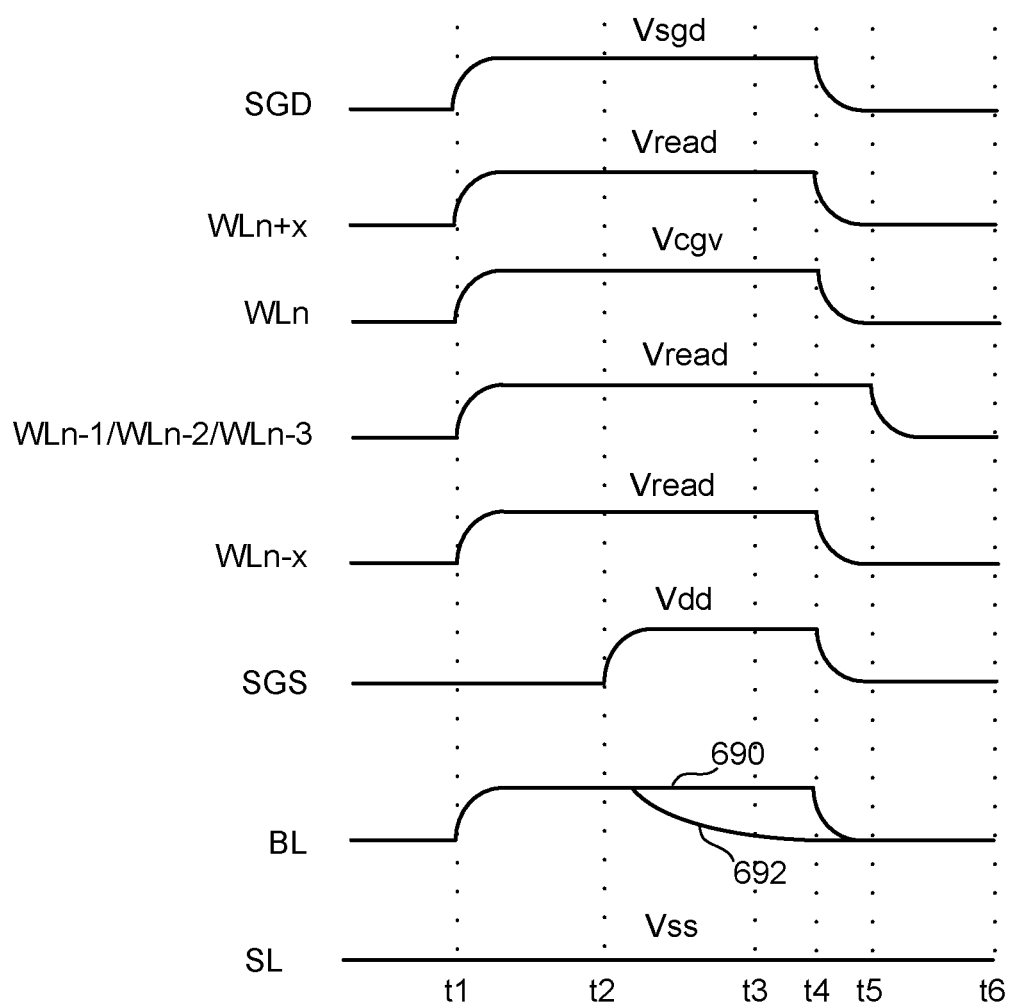
FIG. 14 is a signal diagram describing the behaviors of various signals during a process for verifying programming.

FIG. 14 is a timing diagram depicting various signals during a program verify operation. That is, FIG. 14 depicts an operation performed during step 548 of FIG. 7 and corresponds to the process depicted in steps 752-760 of FIG. 12. The time period depicted in FIG. 14 occurs before and after the time period depicted in FIG. 13, as programming and verifying are performed in an alternating fashion (see loop if step 542-560 in FIG. 7). FIG. 14 shows the drain side selection lines SGD (all which receive the same signal), the selected word line WLn, the drain side unselected word lines WLn+x, the three source side unselected word lines adjacent the selected word line WLn−1/WLn−2/WLn−3, other source side unselected word lines WLn−x, the source side selection lines SGS, the bit lines BL and the source lines SL. At time t1, the selected word line WLn is raised to Vcgv. This corresponds to step 752 of FIG. 12. Vcgv of FIG. 14 is the verify compare voltage described above with respect to FIG. 12. Also at time t1, the drain side selection lines SGD are raised to Vsgd, the bit lines BL are raised to a pre-charge level of approximately 0.7 volts, the drain side unselected word lines WLn+x are raised to Vread, and the source side unselected word lines is WLn−x are raised to Vread. The voltage Vread (e.g., ~6-10 volts) is a bypass voltage which turns on the unselected memory cell so that the current through the channel is determined based on the selected memory cell. In some embodiment, every word line receiving a bypass voltage receives the exact same voltage. In other embodiments, different word lines receiving the bypass voltage receive different voltages. The raising of these unselected word lines to Vread corresponds to step 754 of FIG. 12.

At time t2 of FIG. 14, the source side selection lines SGS are raised to Vdd (e.g. 2.5-3.5 volts). The raising of SGS allows for a pre-charged bit lines BL to discharge through the source if the voltage applied to the selected word line WLn is greater than the threshold voltage of the respective selected memory cell. Decaying signal 692 represents the bit lines discharging. Flat line 690 represents bit lines that do not discharge because the voltage applied to the selected word line WLn is greater than the threshold voltage of the respective selected memory cell. Thus, between times t2 and t3, the memory cells connected to the selected word line are sensed as per step 756 of FIG. 12. At time t4, the signals of FIG. 14 are lowered down to ground, including lowering the selected word line from the verify compare voltage Vcgv to ground (as per step 758). Also at time t4, the drain side unselected word lines WLn+x and the source unselected word lines WLn−x are lowered to ground. At time t5, subsequent to time t4, three source side unselected word lines adjacent to the selected word line are lowered to ground. This corresponds to step 760 of FIG. 12 which includes lowering to ground the source side (or already programmed) unselected word lines adjacent to the selected word lines subsequent to commencing lowering of the drain side word lines WLn+x. The delayed ramp down of the source side (or already programmed) unselected word lines adjacent to the selected word lines keeps the channel open and allows electrons from the Joint area to migrate from the source side channel regions to the drain side channel regions as per step 760 of FIG. 12, thereby, preventing the program disturb described above. In one embodiment, the dummy word lines are operated in the same manner as unselected word lines.

FIG. 15 is a flowchart describing one embodiment of implementing the processes of FIGS. 10, 11 and 12. It has been observed that the program disturb phenomenon described herein is more pronounced at lower temperatures. Therefore, in one embodiment, the countermeasures described above are only performed if the current temperature at the memory die is below a predefined trigger temperature. Thus, in step 802, the memory system senses the current temperature using temperature sensing circuit 318. In step 804, memory system determines whether the current temperature is below the trigger temperature. One example of a trigger temperature is −30 C. Other trigger temperatures can also be used. If the current temperature sensed in step 802 is below the trigger temperature (step 806) then in step 808 the system performs the current programming process with the countermeasures. That is, when programming (e.g. performing the process of FIG. 7) the system will perform either the process of FIG. 10, the process of FIG. 11 or the process of FIG. 12. In one embodiment, the memory system will perform the process of FIG. 10 only (not the process of FIGS. 11 and 12), the process of FIG. 11 only (not the process of FIGS. 10 and 12) or the process of FIG. 12 only (not the process of FIGS. 10 and 11). In another embodiment, the memory system will perform the processes of FIGS. 10, 11 and 12, or a subset thereof. In one example, boosting circuit 581 is configured to apply the voltage spike in response to a sensed temperature below the trigger temperature. In another example, verify circuit 586 is configured to delay ramping down the already programmed unselected word line adjacent to the selected word line in response to a sensed temperature below the trigger temperature. In another example, pre-charge circuit 584 is configured to apply the bypass voltage to the programmed unselected word line that is adjacent to the selected word line in response to a sensed temperature below the trigger temperature.

If it is determined in step 806 that the current temperature is not below the trigger temperature, then the memory system will perform the programming (the process of FIG. 7) in step 810 without performing any of the countermeasures. That is, the process of FIGS. 10 through 12 will not be used. Thus, pre-charging will be performed without applying the bypass voltages to the source side unselected neighbors, boosting will be performed without the voltage spikes discussed above and program verify will be performed with lowering the unselected word line voltages at the same time rather than lowering the source side neighbors subsequent to lowering other word line voltages.

The above-described countermeasures avoid program disturb by opening the channel from one side of a selected word line to the other side of the selected word line (e.g., from the source side of the selected word line to the drain side of the selected word line or from the already programmed side of the selected word line to the not yet programmed side of the selected word line) after a sensing operation for a program verify and prior to a subsequent programming signal being applied. For example, the sensing operation for a program verify is from a previous iteration of step 548 of FIG. 7 (see step 756 of FIG. 12 and t2-t3 of FIG. 14) and the subsequent programming signal being applied is for the next iteration of step 546 of FIG. 7 (see step 656 of FIG. 10, step 704 of FIG. 11 and t7-t8 of FIG. 13). The opening of the channel causes programmed side channel regions of unselected groups of connected memory cells (e.g., unselected NAND strings) to be in electrical communication with unprogrammed side channel regions of the unselected groups of connected memory cells so that electrons on programmed side channel regions of the unselected groups can move to unprogrammed side channel regions of the unselected groups after sensing by the verify circuit and prior to a dose of programming from the programming circuit.

One embodiment includes an apparatus, comprising: a plurality of non-volatile memory cells connected by a channel; a plurality of control lines connected to the non-volatile memory cells; a programming circuit connected to the word lines, the programming circuit configured to apply a programming voltage to a selected word line; and a boosting circuit connected to the word lines. The boosting circuit is configured to boost voltage of the channel by applying boosting voltages to unselected word lines. The boosting circuit is further configured to apply a voltage spike to a programmed unselected word line adjacent to the selected word line while applying the boosting voltages to the unselected word lines.

One embodiment includes an apparatus, comprising: a plurality of non-volatile memory cells; a plurality of control lines connected to the non-volatile memory cells; and a control circuit connected to the control lines. The control circuit is configured to program a first subset of memory cells connected to a selected control line and inhibit programming of a second subset of memory cells connected to the selected control line by applying a programming signal to the selected control line and applying boosting signals to unselected control lines to boost channels for the second subset of memory cells. The applying boosting signals includes applying a spike in a boosting signal for an already programmed unselected control line adjacent to the selected control line while applying the boosting signals to not yet programmed unselected control lines.

One example implementation includes the control circuit being configured to pre-charge channels of groups of connected non-volatile memory cells that include the second subset of memory cells prior to a dose of the programming signal; the control circuit being configured to verify programming of the first set of memory cells by sensing the first set of memory cells; and the spike is a voltage spike which causes programmed side channel regions of groups of connected non-volatile memory cells that include the second subset of memory cells to be in electrical communication with unprogrammed side channel regions of the groups of connected non-volatile memory cells that include the second subset of memory cells so that electrons on programmed side channel regions move to the unprogrammed side channel regions of the groups of connected non-volatile memory cells that include the second subset of memory cells after sensing and prior to a subsequent dose of the programming signal.

One embodiment includes a method comprising: applying a program voltage to a selected word line connected to a plurality of NAND strings; applying boosting voltages to unselected word lines connected to the plurality of NAND strings on a source side of the selected word line and on a drain side of the selected word line, the unselected word lines include a source side neighbor word line that is adjacent to the selected word line; and applying a voltage spike to the source side neighbor word line while applying the boosting voltages to the unselected word lines on the drain side of the selected word line.

One embodiment includes an apparatus, comprising: a monolithic three dimensional memory array comprising a lower set of alternating conductive and dielectric layers and an upper set of alternating conductive and dielectric layers separated by a joint that together form a plurality of word lines and a plurality of vertical charge-trapping NAND strings each having a channel. The apparatus also comprises means for providing a series of programming pulses to a selected word line to program memory cells connected to the selected word line that are in selected NAND strings; means for boosting the channels of unselected NAND strings including boosting source side of channels of unselected NAND strings and drain side of channels of unselected NAND strings with respect to the selected word line; and means for electrically communicating between source side of channels of unselected NAND strings and drain side of channels of unselected NAND strings while boosting source side of channels of unselected NAND strings and drain side of channels of unselected NAND strings.

One embodiment includes an apparatus, comprising a plurality of non-volatile memory cells, control lines connected to the memory cells, a write circuit connected to the control lines and configured to write data to selected memory cells by applying a program voltage to a selected control line, and a verify circuit connected to the control lines and configured to verify writing of data to the selected memory cells by applying non-zero voltages to the control lines and sensing the selected memory cells. The verify circuit is further configured to ramp down the voltages on the control lines after the sensing such that an already programmed unselected control line adjacent to a selected control line is ramped down subsequent to ramping down other control lines.

One embodiment includes a method comprising: programming memory cells connected to a selected control line, the memory cells are part of a memory array; applying a verify compare voltage to the selected control line; applying bypass voltages to unselected control lines connected to the memory array; sensing the memory cells connected to the selected control line in response to the verify compare voltage; lowering the selected control line from the verify compare voltage to ground; and lowering the unselected control lines from the bypass voltages to ground including commencing lowering to ground source side unselected control lines adjacent to the selected control line subsequent to commencing lowering drain side unselected control lines.

One embodiment includes an apparatus comprising a first plurality of connected non-volatile memory cells, a plurality of control lines connected to the first plurality of connected non-volatile memory cells, and a control circuit connected to the control lines. The control circuit is configured to verify programming of a selected memory cell of the first plurality of connected non-volatile memory cells that is connected to a selected control line by applying voltages to the plurality of control lines, sensing the selected memory cell and ramping down the voltages on the control lines after performing the sensing such that an already programmed unselected control line adjacent to the selected control line is ramped down subsequent to ramping down another already programmed control line and a not yet programmed control line.

One example implementation includes the ramping down the voltages on the control lines after performing the sensing such that the already programmed unselected control line adjacent to the selected control line is ramped down subsequent to ramping down another already programmed control line and a not yet programmed control line causes a programmed side of the second channel to be in electrical communication with unprogrammed side of the second channel so that electrons on the programmed side of the second channel move to the unprogrammed side of the second channel.

One embodiment includes an apparatus comprising a monolithic three dimensional memory array comprising a lower set of alternating conductive and dielectric layers and an upper set of alternating conductive and dielectric layers separated by a joint area that together form a plurality of word lines and a plurality of vertical charge-trapping NAND strings each having a channel; means for programming a selected memory cell connected to a selected word line; and means for verifying programming of the selected memory cell by applying a compare voltage to the selected word line and bypass voltages to unselected word line lines, sensing the selected memory cell in response to the compare voltage, lowering the selected word line from the compare voltage to ground and lowering the unselected word lines from the bypass voltages to ground such that a source side unselected word line adjacent to the selected word line and on a drain side of the joint area is lowered to ground subsequent to lowering drain side word lines to ground.

One embodiment includes an apparatus, comprising: a plurality of non-volatile memory cells including a plurality of channels; a plurality of control lines connected to the memory cells; a programming circuit connected to the control lines, the programming circuit configured to apply a programming voltage to a selected control line to program selected memory cells connected to the selected control line; a boosting circuit connected to the control lines, the boosting circuit configured to boost voltage of channels connected to unselected memory cells; and a pre-charge circuit connected to the control lines. The pre-charge circuit configured to pre-charge the channels connected to unselected memory cells prior to boosting the voltage of the channels connected to unselected memory cells. The pre-charge circuit further configured to apply a bypass voltage to a programmed side unselected control line that is adjacent to the selected control line while pre-charging the channels connected to unselected memory cells.

In one example implementation, the pre-charge circuit is configured to not pre-charge source sides of the channels connected to unselected memory cells while pre-charging drain sides of the channels connected to unselected memory cells and the pre-charge circuit is configured to apply one or more voltages to source side unselected control that are too low to pre-charge and too low to turn on memory cells in a highest data state.

One embodiment includes an apparatus comprising a plurality of non-volatile memory cells; a plurality of control lines connected to the memory cells; and a control circuit connected to the control lines. The control circuit is configured to program a first subset of the memory cells connected to a selected control line and inhibit programming of a second subset of the memory cells connected to the selected control line by applying a programming signal to the selected control line and applying boosting signals to unselected control lines to boost channels for the second subset of the memory cells, the control circuit further configured to pre-charge channels for the second subset of the memory cells prior to the applying the boosting signals and apply a bypass voltage to an already programmed side unselected control line adjacent to the selected control line while pre-charging channels for the second subset of the memory cells.

One example implementation includes the plurality of control lines comprises a first stack of alternating word line layers and dielectric layers, a second stack of alternating word line layers and dielectric layers, and a joint area between the first stack and the second stack; the selected control line is a selected word line in the second stack; and the applying the bypass voltage puts a programmed side of the channels for the second subset of the memory cells to be in electrical communication with an unprogrammed side for the second subset of the memory cells to allow electrons positioned in the joint area to move from the programmed side of the channels for the second subset of the memory cells into the unprogrammed side of the channels for the second subset of the memory cells.

One embodiment includes a method comprising applying a program voltage to a selected word line connected to a plurality of NAND strings; boosting channels of unselected NAND strings; pre-charging channels of at least a subset of the unselected NAND strings prior to the boosting; and applying a bypass voltage to an already programmed side unselected word line adjacent to the selected word line while pre-charging.

One embodiment includes an apparatus comprising a monolithic three dimensional memory array comprising a lower set of alternating conductive and dielectric layers and an upper set of alternating conductive and dielectric layers separated by a joint area that together form a plurality of word lines and a plurality of vertical charge-trapping NAND strings each having a channel. The apparatus further comprises means for providing a series of programming pulses to a selected word line to program memory cells connected to the selected word line that are in selected NAND strings, means for boosting the channels of unselected NAND strings, means for pre-charging the channels of unselected NAND strings prior to boosting and means for applying a bypass voltage to an already programmed side unselected word line adjacent to the selected word line while pre-charging to cause a first side of the unselected NAND strings with respect to the selected word line to be in electrical communication with a second side of the unselected NAND strings.

Means for providing a series of programming pulses can include controller 120, control circuitry 310, state machine 312 in combination with power control circuit 316, programming/write circuit 580 or control circuit 590. The means for providing a series of programming pulses can be implemented by dedicated hardware (e.g., electrical circuit), a processor programmed by software, an FPFA, a state machine, a microcontroller or equivalent thereof.

Means for boosting can include controller 120, control circuitry 310, state machine 312 in combination with power control circuit 316, boosting circuit 582 or control circuit 590. The means for boosting can be implemented by dedicated hardware (e.g., electrical circuit), a processor programmed by software, an FPFA, a state machine, a microcontroller or equivalent thereof. The means for boosting performs step 706 and 708 of FIG. 11 and portions of FIG. 13.

Means for electrically communicating can include controller 120, control circuitry 310, state machine 312 in combination with power control circuit 316, boosting circuit 582 or control circuit 590. The means for boosting can be implemented by dedicated hardware (e.g., electrical circuit), a processor programmed by software, an FPFA, a state machine, a microcontroller or equivalent thereof.

Means for programming can include controller 120, control circuitry 310, state machine 312 in combination with power control circuit 316, programming/write circuit 580 or control circuit 590. The means for programming can be implemented by dedicated hardware (e.g., electrical circuit), a processor programmed by software, an FPFA, a state machine, a microcontroller or equivalent thereof.

Means for verifying can include controller 120, control circuitry 310, state machine 312 in combination with sense blocks 350 and power control circuit 316, verify circuit 586 or control circuit 590. The means for programming can be implemented by dedicated hardware (e.g., electrical circuit), a processor programmed by software, an FPFA, a state machine, a microcontroller or equivalent thereof. The means for verifying performs steps 752-760 of FIG. 12 and the process of FIG. 14.

Means for pre-charging can include controller 120, control circuitry 310, state machine 312 in combination with power control circuit 316, pre-charge circuit 584 or control circuit 590. The means for programming can be implemented by dedicated hardware (e.g., electrical circuit), a processor programmed by software, an FPFA, a state machine, a microcontroller or equivalent thereof. The means for pre-charging performs steps 650 and 652 of FIG. 10 and portions of FIG. 13.

Means for applying a bypass voltage to an already programmed unselected word line can include controller 120, control circuitry 310, state machine 312 in combination with power control circuit 316, pre-charge circuit 584 or control circuit 590. The means for programming can be implemented by dedicated hardware (e.g., electrical circuit), a processor programmed by software, an FPFA, a state machine, a microcontroller or equivalent thereof. The means for pre-charging performs step 652 of FIG. 10 and portions of FIG. 13.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells including a plurality of channels;
a plurality of control lines connected to the memory cells;
a programming circuit connected to the control lines, the programming circuit configured to apply a programming voltage to a selected control line to program selected memory cells connected to the selected control line;
a boosting circuit connected to the control lines, the boosting circuit configured to boost voltage of channels connected to unselected memory cells; and
a pre-charge circuit connected to the control lines, the pre-charge circuit configured to pre-charge the channels connected to unselected memory cells prior to boosting the voltage of the channels connected to unselected memory cells, the pre-charge circuit further configured to apply a bypass voltage to a programmed side unselected control line that is adjacent to the selected control line while pre-charging the channels connected to unselected memory cells, the pre-charge circuit configured to pre-charge the channels connected to unselected memory cells by applying a pre-charge voltage to unprogrammed side unselected control lines, the bypass voltage is greater than the pre-charge voltage, the bypass voltage comprises a voltage of a magnitude sufficient to cause memory cells receiving the bypass voltage to turn on regardless of which data state the memory cells are programmed or erased to.

2. The apparatus of claim 1, wherein:
the pre-charge circuit configured to pre-charge unprogrammed sides of the channels connected to unselected memory cells prior to boosting the voltage of the channels connected to unselected memory cells, the pre-charge circuit configured to apply the bypass voltage to the programmed side unselected control line that is adjacent to the selected control line while pre-charging unprogrammed sides of the channels connected to unselected memory cells.

3. The apparatus of claim 1, wherein:
the pre-charge circuit configured to pre-charge drain sides of the channels connected to unselected memory cells prior to boosting the voltage of the channels connected to unselected memory cells by applying pre-charge voltages to drain side unselected control lines, the pre-charge circuit configured to apply the bypass voltage to source side unselected control lines while pre-charging the drain side of channels connected to unselected memory cells, the source side and the drain side are with respect to the selected control line.

4. The apparatus of claim 1, wherein:
the pre-charge circuit configured to not pre-charge source sides of the channels connected to unselected memory cells while pre-charging drain sides of the channels connected to unselected memory cells; and
the pre-charge circuit configured to apply one or more voltages to source side unselected control that are too low to pre-charge and too low to turn on memory cells in a highest data state.

5. The apparatus of claim 1, wherein:
the plurality of control lines comprises a first stack of alternating control line layers and dielectric layers, a second stack of alternating control line layers and dielectric layers, and a joint area between the first stack and the second stack;
the selected control line is in the second stack; and
the applying the bypass voltage to the programmed unselected control line that is adjacent to the selected control line while pre-charging channels of the unselected groups maintains a programmed side of the channels of unselected groups to be in electrical communication with an unprogrammed side of the channels of unselected groups to allow electrons positioned in the joint area to move from the programmed side of the channels of unselected groups into the unprogrammed side of the channels of unselected groups.

6. An apparatus, comprising:
a plurality of non-volatile memory cells;
a plurality of control lines connected to the memory cells; and
a control circuit connected to the control lines, the control circuit configured to program a first subset of the memory cells connected to a selected control line and inhibit programming of a second subset of the memory cells connected to the selected control line by applying a programming signal to the selected control line and applying boosting signals to unselected control lines to boost channels for the second subset of the memory cells, the control circuit further configured to pre-charge channels for the second subset of the memory cells prior to the applying the boosting signals by applying a pre-charge voltage to not yet programmed unselected control lines and apply a bypass voltage to an already programmed unselected control line adjacent to the selected control line while pre-charging channels for the second subset of the memory cells, the bypass voltage comprises a voltage of a magnitude sufficient to cause memory cells receiving the bypass voltage to turn on regardless of which data state the memory cells are programmed or erased to.

7. The apparatus of claim 6, wherein:
the control circuit is configured apply one or more bypass voltages to multiple already programmed unselected control lines while pre-charging channels for the second subset of the memory cells.

8. The apparatus of claim 6, wherein:
the already programmed unselected control line adjacent to the selected control line is on a programmed side of the selected control line;
the not yet programmed unselected control lines are on a unprogrammed side of the selected control line;
the bypass voltage is greater than the pre-charge voltage; and
the pre-charge voltage is greater than zero volts.

9. The apparatus of claim 6, wherein:
the control circuit is configured to pre-charge channels for the second subset of the memory cells by applying positive voltage to unprogrammed side unselected control lines and programmed side unselected control lines, the already programmed side unselected control line adjacent to the selected control line is on a programmed side of the selected control line.

10. The apparatus of claim 6, wherein:
the control circuit is configured to pre-charge channels for the second subset of the memory cells by applying positive voltage to drain side unselected control lines, the already programmed side unselected control line adjacent to the selected control line is on a source side of the selected control line, the control circuit is configured to apply the bypass voltage to the already programmed side unselected control line adjacent to the selected control line while pre-charging drain side channels for the second subset of the memory cells.

11. The apparatus of claim 6, wherein:
the control circuit is configured to pre-charge unprogrammed side channels for the second subset of the memory cells prior to the applying boosting signals by applying the pre-charge voltage to the not yet programmed unselected control lines and a third voltage to programmed side unselected control lines that are not adjacent to the selected control line, the bypass voltage is greater than the pre-charge voltage, the pre-charge voltage is greater than the third voltage, the third voltage is too low to pre-charge and too low to turn on memory cells in a highest data state.

12. The apparatus of claim 6, wherein:
the control circuit is configured to pre-charge drain side channels for the second subset of the memory cells prior to the applying boosting signals and apply the bypass voltage to the already programmed side unselected control line adjacent to the selected control line while pre-charging the drain side channels for the second subset of the memory cells, the already programmed side unselected control line adjacent to the selected control line is on a source side of the selected control line.

13. The apparatus of claim 6, wherein:
the control circuit is configured to pre-charge drain side and source side of channels for the second subset of the memory cells prior to the applying boosting signals and applying the bypass voltage to the already programmed side unselected control line adjacent to the selected control line while pre-charging the drain side and source side channels for the second subset of the memory cells, the already programmed side unselected control line adjacent to the selected control line is on the source side.

14. The apparatus of claim 6, wherein:
the plurality of control lines comprises a first stack of alternating word line layers and dielectric layers, a second stack of alternating word line layers and dielectric layers, and a joint area between the first stack and the second stack;
the selected control line is a selected word line in the second stack; and
the applying the bypass voltage puts a programmed side of the channels for the second subset of the memory cells to be in electrical communication with an unprogrammed side for the second subset of the memory cells to allow electrons positioned in the joint area to move from the programmed side of the channels for the second subset of the memory cells into the unprogrammed side of the channels for the second subset of the memory cells.

15. The apparatus of claim 6, wherein:
the control circuit configured to program the first subset of memory cells and inhibit programming of the second subset of memory cells by applying a programming allow signal to bit lines for the first subset of memory cells and applying an inhibit signal to bit lines for the second subset of memory cells;
the control lines are word lines;
the memory cells are arranged in vertical NAND strings with charge trapping regions; and
the memory cells, the plurality of control lines and the control circuit are on a same die.

16. A method, comprising:
applying a program voltage to a selected word line connected to a plurality of NAND strings;
boosting channels of unselected NAND strings;
pre-charging channels of at least a subset of the unselected NAND strings prior to the boosting by applying a pre-charge voltage to unprogrammed side unselected word lines; and
applying a bypass voltage to an already programmed side unselected word line adjacent to the selected word line while pre-charging, the bypass voltage is greater than the pre-charge voltage, the bypass voltage comprises a voltage of a magnitude sufficient to cause memory cells receiving the bypass voltage to turn on regardless of which data state the memory cells are programmed or erased to.

17. The method of claim 16, wherein:
the boosting channels include applying boosting voltages to unselected word lines prior to applying the program voltage to the selected word line; and
the pre-charging channels of at least a subset of the unselected NAND strings comprises pre-charging an unprogrammed side of the channels of at least the subset of the unselected NAND strings by applying pre-charge voltages to unprogrammed side unselected word lines prior to the applying boosting voltages to unselected word lines; and
the applying the bypass voltage comprises applying the bypass voltage to multiple programmed side unselected word lines while applying pre-charge voltages to unprogrammed side unselected word lines.

18. The method of claim 16, wherein:
the NAND strings include memory cells; and
the pre-charging channels further comprises applying a third voltage to already programmed side unselected word lines that are not adjacent to the selected control line, the pre-charge voltage is greater than the third voltage, the third voltage is too low to pre-charge and too low to turn on memory cells in a highest data state.

19. The method of claim 16, wherein:
the pre-charging channels of at least a subset of the unselected NAND strings comprises pre-charging a drain side and a source side of channels of unselected NAND strings.

20. The method of claim 16, wherein:
the selected word line and unselected word lines comprise a first stack of alternating word line layers and dielectric layers, a second stack of alternating word line layers and dielectric layers, and a joint area between the first stack and the second stack; and
the applying the bypass voltage to the already programmed side unselected word line adjacent to the selected word line while pre-charging causes electrons from the joint area to migrate from source side channel regions to drain side channel regions of unselected NAND strings.

21. An apparatus, comprising:
a monolithic three dimensional memory array comprising a lower set of alternating conductive and dielectric layers and an upper set of alternating conductive and dielectric layers separated by a joint area that together form a plurality of word lines and a plurality of vertical charge-trapping NAND strings each having a channel;
means for providing a series of programming pulses to a selected word line to program memory cells connected to the selected word line that are in selected NAND strings;
means for boosting the channels of unselected NAND strings;
means for pre-charging the channels of unselected NAND strings prior to boosting; and
means for applying a bypass voltage to an already programmed side unselected word line adjacent to the selected word line while pre-charging to cause a first side of the unselected NAND strings with respect to the selected word line to be in electrical communication with a second side of the unselected NAND strings, the bypass voltage comprises a voltage of a magnitude sufficient to cause memory cells receiving the bypass voltage to turn on regardless of which data state the memory cells are programmed or erased to.

\* \* \* \* \*